(12) United States Patent
Porter et al.

(10) Patent No.: US 11,550,104 B2
(45) Date of Patent: Jan. 10, 2023

(54) SELECTOR SWITCH

(71) Applicant: The Regents of the University of California, Oakland, CA (US)

(72) Inventors: George Porter, San Diego, CA (US);
Joseph Ford, Solana Beach, CA (US);
Alex Snoeren, San Diego, CA (US);
George Papen, San Diego, CA (US);
William Mellette, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 772 days.

(21) Appl. No.: 16/334,694

(22) PCT Filed: Sep. 19, 2017

(86) PCT No.: PCT/US2017/052309
§ 371 (c)(1),
(2) Date: Mar. 19, 2019

(87) PCT Pub. No.: WO2018/053527
PCT Pub. Date: Mar. 22, 2018

(65) Prior Publication Data
US 2021/0141158 A1 May 13, 2021

Related U.S. Application Data

(60) Provisional application No. 62/396,708, filed on Sep. 19, 2016.

(51) Int. Cl.
*G02B 6/35* (2006.01)
*G02B 6/26* (2006.01)
(Continued)

(52) U.S. Cl.
CPC .......... *G02B 6/3518* (2013.01); *G02B 6/262* (2013.01); *G02B 6/3526* (2013.01);
(Continued)

(58) Field of Classification Search
CPC .... G02B 6/3518; G02B 6/262; G02B 6/3526; G02B 6/3554; G02B 6/0833; G02B 6/0883; H03K 17/56
(Continued)

(56) References Cited

U.S. PATENT DOCUMENTS

| 4,782,478 A | 11/1988 | Day, Jr. et al. |
| 2002/0145786 A1 | 10/2002 | Chang et al. |

(Continued)

FOREIGN PATENT DOCUMENTS

| CA | 2310856 A1 | 12/2001 |
| WO | WO-2005002276 A1 | 1/2005 |
| WO | WO-2006035202 A1 | 4/2006 |

OTHER PUBLICATIONS

100G CWDM4 MSA Technical Specifications. Available: http://www.cwdm4-msa.org/wp-content/uploads/2015/12/CWDM4-MSA-Technical-Spec-1p1-1.pdf.
(Continued)

*Primary Examiner* — Jerry M Blevins
(74) *Attorney, Agent, or Firm* — Mintz Levin Cohn Ferris Glovsky and Popeo, P.C.

(57) ABSTRACT

An apparatus for network switching may include a plurality of input ports, a plurality of output ports, and a subset of pre-configured interconnection patterns including some but not all of the possible interconnection patterns between the input ports and the output ports. The apparatus may be communicatively coupled to a network via the input ports and/or the output ports. The apparatus may be configured to switch to a first interconnection pattern and a second interconnection pattern from the subset of pre-configured interconnection patterns. The first interconnection pattern and the second interconnection pattern may each provide a set of connections between the input ports and the output ports. At least one signal between the input ports and the output ports (Continued)

may be transmitted via the first interconnection pattern and/or the second interconnection pattern. Related methods are also provided.

19 Claims, 22 Drawing Sheets

(51) Int. Cl.
    *G02B 26/08*     (2006.01)
    *H03K 17/56*     (2006.01)

(52) U.S. Cl.
    CPC ....... *G02B 6/3554* (2013.01); *G02B 26/0833* (2013.01); *G02B 26/0883* (2013.01); *H03K 17/56* (2013.01)

(58) Field of Classification Search
    USPC .......................................................... 385/33
    See application file for complete search history.

(56) References Cited

U.S. PATENT DOCUMENTS

| | | | |
|---|---|---|---|
| 2006/0049468 A1 | 3/2006 | Cheng et al. | |
| 2008/0131119 A1* | 6/2008 | Okada | H04Q 11/0005 398/45 |
| 2011/0234951 A1* | 9/2011 | Cohen | G02B 6/293 11 349/113 |
| 2012/0263417 A1* | 10/2012 | LeBlanc | G02B 6/25 385/50 |
| 2015/0098678 A1* | 4/2015 | Miglani | G02B 6/35 12 385/17 |
| 2016/0007102 A1 | 1/2016 | Raza et al. | |
| 2016/0034625 A1* | 2/2016 | Wang | G06F 30/34 716/117 |

OTHER PUBLICATIONS

Beth, T. et al., "A restricted crossbar implementation and its applications," ACM SIGARCH Computer Architecture News 19.6, pp. 12-16, 1991.
Cheng, Q. et al., "Low-Energy, High-Performance Lossless 8 8 SOA Switch," in Proc. Opt. Fiber Conf., 2015.
Clos, C. "A Study of Non-blocking Switching Networks," Bell System Technical Journal, vol. 32, No. 2, pp. 406-424, 1953.
European Search Report issued in European Application No. EP17851801.5-1206, dated May 20, 2020, (May 20, 2020). 12 pages.
Farrington, N. et al., "Hardware Requirements for Optical Circuit Switched Data Center Networks," Proc. Opt. Fiber Commun. Conf., 2011, 3 pages.
Farrington, N. et al., "Helios: A Hybrid Electrical/Optical Switch Architecture for Modular Data Centers," in Proc. ACM SIGCOMM Conf., 2010, pp. 339-350.
FiberGuide Spec. Sheet. Available: http://www.fiberguide.com/wp-content/uploads/2012/08/V-Grooves_Arrays_FINAL.pdf.
International Search Report and Written Opinion issued in International Application No. PCT/US2017/052309, dated Nov. 24, 2017, (Nov. 24, 2017). 11 pages.
Ford, J. et al., "Reconfigurable array interconnection by photorefractive correlation," Appl. Opt. 33(23), 5363-5377 (1994).
Janhs, J. et al., "Crossover networks and their optical implementation," Applied Optics, vol. 27, No. 15, pp. 3155-3160, 1998.
Kim, J. et al., "1100 x 1100 Port MEMS-Based Optical Crossconnect With 4-dB Maximum Loss," IEEE Photonics Technology Letters, 15(11), 1537-1539 (2003).
Kopp, V. et al., "Chiral Fibers: Microformed Optical Waveguides for Polarization Control, Sensing, Coupling, Amplification, and Switching," JLT 32(4), 605-613 (2014).
Lu, L. et al., "Broadband 4 4 Nonblocking Silicon Electrooptic Switches Based on Mach-Zehnder Interferometers," Photon. J., vol. 7, No. 1, pp. 1-8, 2015.
Mekis, A. et al., "A Grating-Coupler-Enabled CMOS Photonics Platform," J. Sel. Topics Quantum Electron., vol. 17, No. 3, pp. 597-608, 2011.
Mellette, W. et al., "Scaling Limits of MEMS Beam-Steering Switches for Data Center Networks," JLT 33(15), 3308-3318 (2015).
Mirrorcle Technologies. Available: http://mirrorcletech.com/.
Pardo, F. et al., "Flexible fabrication of large pixel count piston-tip-tilt mirror arrays for fast spatial light modulators," Microelectron. Eng., vol. 84, pp. 11571161, 2007.
Porter, G. et al., "Integrating microsecond circuit switching into the data center," in Proc. ACM SIGCOMM Conf., 2013, pp. 447-458.
Roy, A. et al., "Inside the social network's (datacenter) network," in Proc. ACM SIGCOMM Conf., 2015, pp. 123-137.
Seok, T. et al., "Large-scale broadband digital silicon photonic switches with vertical adiabatic couplers," Optica, vol. 3, No. 1, pp. 64-70, 2016.
Singh, A. et al., "Jupiter Rising: A Decade of Clos Topologies and Centralized Control in Google's Datacenter Network," in Proc. ACM SIGCOMM Conf., 2015, pp. 183-197.
Stoica, I. et al., "Chord: A scalable peer-to-peer lookup service for internet applications," in Proc. ACM SIGCOMM, 2001, 149-160.
Suleski, T. et al., "Fabrication trends for free-space microoptics," J. Lightw. TechnoL, vol. 23, No. 2, pp. 633-646, 2005.
Suzuki, K. et al., "Ultra-compact 8 8 strictly-non-blocking Si-wire PILOSS switch," Optics Express, vol. 22, No. 4, pp. 3887-3894, 2014.
Tanizawa, K. et al., "Ultra-compact 32 32 strictly-non-blocking Si-wire optical switch with fan-out LGA interposer," Optics Express, vol. 23, No. 13, pp. 17599-17606, 2015.
Vahdat, A. et al., "The Emerging Optical Data Center," in Proc. Opt. Fiber Commun. Conf., 2011.
Wagner, R. et al., "Coupling efficiency of optics in single-mode fiber components," Applied Optics, vol. 21, No. 15, pp. 2671-2688, 1982.
Wu, C. et al., "On a Class of Multistage Interconnection Networks," Trans. Comput., vol. C-29, No. 8, pp. 694-702, 1980.

\* cited by examiner

SELECTOR SWITCH

RELATED APPLICATION

This application is a national phase entry of Patent Cooperation Treaty Application PCT/US2017/052309 filed Sep. 19, 2017, entitled "SELECTOR SWITCH," which claims the benefit of U.S. Provisional Application 62/396,708 filed on Sep. 19, 2016, entitled "A SCALABLE MEMS-BASED "SELECTOR SWITCH" FOR HIGH PERFORMANCE COMPUTING NETWORKS," the disclosures of which are incorporated herein by reference in their entirety.

STATEMENT AS TO FEDERALLY SPONSORED RESEARCH

This invention was made with government support under CNS1314921 awarded by the National Science Foundation. The government has certain rights in the invention.

TECHNICAL FIELD

The subject matter disclosed herein relates generally to computing networks and more specifically to network switches.

BACKGROUND

A network of computing nodes may be interconnected via one or more switches. For example, a crossbar switch may include a matrix of individual switching elements. A dedicated connection may be established between any input port of the crossbar switch and any output port of the crossbar switch by toggling the individual switching elements in the matrix.

SUMMARY

Apparatuses and methods for network switching are provided. An apparatus for network switching may include a plurality of input ports, a plurality of output ports, and a subset of pre-configured interconnection patterns comprising some but not all of a plurality of possible interconnection patterns between the plurality of input ports and the plurality of output ports. The apparatus may be communicatively coupled to a network via the plurality of input ports and/or the plurality of output ports. The apparatus may be configured to at least: switch to a first interconnection pattern from the subset of pre-configured interconnection patterns, the first interconnection pattern providing a first set of connections between the plurality of input ports and the plurality of output ports; switch to a second interconnection pattern from the subset of pre-configured interconnection patterns, the second interconnection pattern providing a second set of connections between the plurality of input ports and the plurality of output ports; and transmit, via the first interconnection pattern and/or the second interconnection pattern, at least one signal between the plurality of input ports and the plurality of output ports.

In some variations, one or more features disclosed herein including the following features can optionally be included in any feasible combination. The apparatus may be configured to at least switch to the first interconnection pattern at a first time and the second interconnection pattern at a second time. The apparatus may include a first selector switch and a second selector switch. The first selector switch may be configured to at least switch to the first interconnection pattern and the second selector switch may be configured to at least switch to the second interconnection pattern. The first selector switch and the second selector switch may be configured to operate in parallel.

In some variations, the first selector switch and the second selector switch may be configured to at least switch to a third interconnection pattern. The first interconnection pattern and the second interconnection pattern may be formed based on the third interconnection pattern. The first interconnection and the second interconnection pattern may be formed by the first selector switch being coupled with a different permutation of the plurality of input ports than the second selector switch.

In some variations, the subset of pre-configured interconnection patterns may provide at least one connection between each of the plurality of input ports and each of the plurality of output ports. The at least one connection may be a direct connection between an input port and an output port. Alternatively and/or additionally, the at least one connection may be an indirect connection between an input port and an output port. The indirect connection may include at least one hop through an intermediary input port and/or an intermediary output port. The apparatus may be further configured to at least store, at the intermediary input port and/or the intermediary output port, data being transferred between the input port and the output port.

In some variations, the apparatus may include a subset of switching elements comprising some but not all of a plurality of switching elements required to fully interconnect the plurality of input ports and the plurality of output ports. The first interconnection pattern and/or the second interconnection pattern may be pre-configured based at least on a selection of switching elements forming the subset of switching elements. The apparatus may be configured to at least route the at least one signal via the first interconnection pattern and/or the second interconnection pattern by at least toggling the plurality of switching elements. The plurality of switching elements may include one or more electronic transistors, optical waveguide switching devices, passive optical elements, and/or beam steering devices. The first interconnection pattern and/or the second interconnection pattern may be formed from one or more electrically conductive wires, optical waveguides, fiber optic cables, and/or passive optical elements.

In some variations, the apparatus may include at least one selector module configured to at least switch between a first coupling and a second coupling. The first coupling may couple the plurality of input ports and/or the plurality of output ports with the first interconnection pattern. The second coupling may couple the plurality of input ports and/or the plurality of output ports with the second interconnection pattern. The at least one selector module may include a first set of module ports coupled with the first interconnection pattern and a second set of module ports coupled with the second interconnection. The at least one selector module may be configured to at least switch to the first coupling by at least routing the at least one signal through the first set of module ports and switch to the second coupling by at least routing the at least one signal through the second set of module ports.

In some variations, the at least one selector module may include a beam steering device. The beam steering device may include one or more electromechanical mirrors. The beam steering device may include a rotating optical element comprising a plurality of reflective, refractive, and/or diffractive regions.

In some variations, the selector module may further include a prism array having a first prism and a second prism. The first prism may be aligned to direct the at least one signal to the first set of module ports. The second prism may be aligned to direct the at least one signal to the second set of module ports. The beam steering device may be configured to at least steer the at least one signal onto the first prism in order to image the at least one signal to the first set of module ports. The beam steering device may be configured to at least steer the at least one signal onto the second prism in order to image the at least one signal to the second set of module ports.

In some variations, the selector module may further include a lens array having a first lens and a second lens. The first lens and the second lens may be segments of a same lens. The first lens may be aligned to direct the at least one signal to the first set of module ports. The second lens may be aligned to direct the at least one signal to the second set of module ports. The beam steering device may be configured to at least steer the at least one signal onto the first lens in order the image the at least one signal to the first set of module ports. The beam steering device may be configured to at least steer the at least one signal onto the second lens in order to image the at least one signal to the second set of module ports.

In some variations, the first interconnection pattern and/or the second interconnection pattern are formed from one or more fiber optic cables and/or passive optical elements. The at least one signal may include an electric signal, an optic signal, and/or a radio frequency signal.

In some variations, the apparatus may include a controller configured to at least generate one or more control signals to control the switch to the first interconnection pattern and/or the switch to the second interconnection pattern. The one or more control signals may be generated based on a predetermined schedule and/or in response to an input from the network.

A method of network switching may include: switching to a first interconnection pattern from a subset of pre-configured interconnection patterns, the first interconnection pattern providing a first set of connections between a plurality of input ports and a plurality of output ports, the plurality of input ports and the plurality of output ports comprising an apparatus, the apparatus being communicatively coupled to a network via the plurality of input ports and/or the plurality of output ports, and the subset of pre-configured interconnection patterns comprising some but not all of a plurality of possible interconnection patterns between the plurality of input ports and the plurality of output ports; switching to a second interconnection pattern from the subset of pre-configured interconnection patterns, the second interconnection pattern providing a second set of connections between the plurality of input ports and the plurality of output ports; and transmitting, via the first interconnection pattern and/or the second interconnection pattern, at least one signal between the plurality of input ports and the plurality of output ports.

An apparatus for network switching may include: means for switching to a first interconnection pattern from a subset of pre-configured interconnection patterns, the first interconnection pattern providing a first set of connections between a plurality of input ports and a plurality of output ports, the plurality of input ports and the plurality of output ports comprising an apparatus, the apparatus being communicatively coupled to a network via the plurality of input ports and/or the plurality of output ports, and the subset of pre-configured interconnection patterns comprising some but not all of a plurality of possible interconnection patterns between the plurality of input ports and the plurality of output ports; means for switching to a second interconnection pattern from the subset of pre-configured interconnection patterns, the second interconnection pattern providing a second set of connections between the plurality of input ports and the plurality of output ports; and means for transmitting, via the first interconnection pattern and/or the second interconnection pattern, at least one signal between the plurality of input ports and the plurality of output ports.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to a network switch, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

When practical, similar reference numbers denote similar structures, features, or elements.

DETAILED DESCRIPTION

Figure 1:
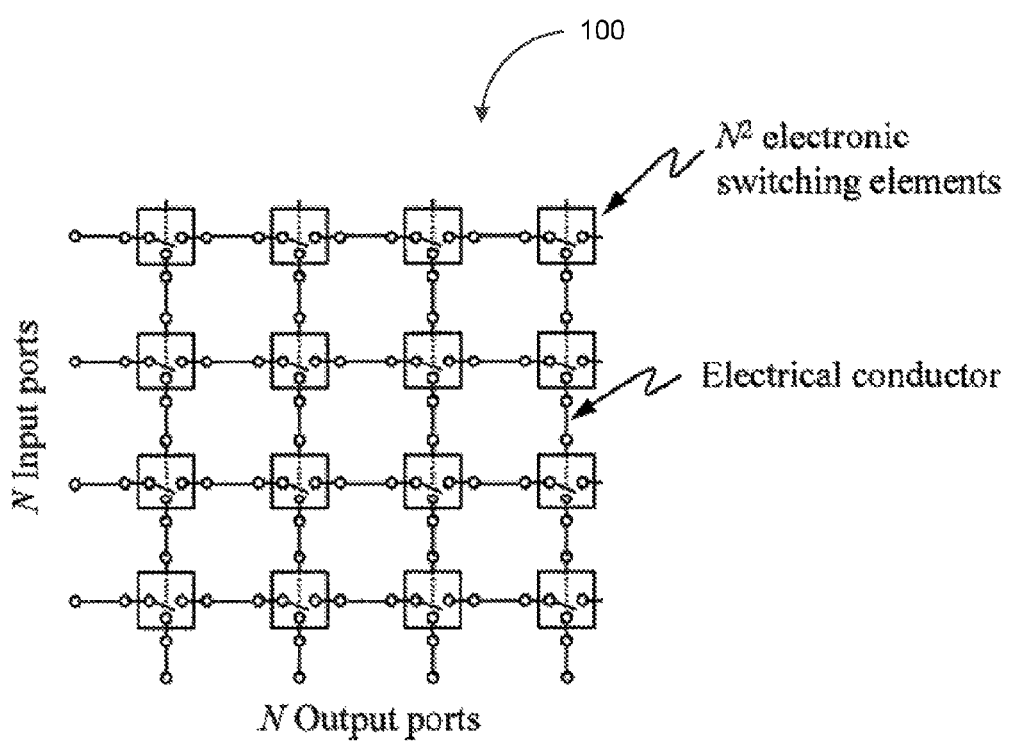
FIG. 1 depicts a schematic diagram illustrating a fully configurable crossbar switch, in accordance with some example embodiments.

A conventional computing network may rely on crossbar switches in order to achieve a fully interconnected network topology. Crossbar switches may be fully configurable. That is, as noted, the individual switching elements in a crossbar switch may be toggled to form arbitrary interconnection patterns between input ports and output ports in the crossbar switch. An interconnection pattern may be a set of connections connecting each input port of the crossbar switch to a unique output port of the crossbar switch. However, the cost of constructing a fully interconnected computing network using crossbar switches may be prohibitive. For example, a large scale computing network may require crossbar switches having numerous stages of switching elements. The extensive hardware is not only expensive but may also give rise to undesirable signal degradation including, for example, crosstalk, insertion loss, and/or the like.

In some example embodiments, a selector switch may be used to interconnect nodes in a computing network. The selector switch may be configured to switch only between a subset of all of the possible interconnection patterns between the input ports and the output ports of the selector switch. This subset of pre-configured interconnection patterns may include some, but not all, of the possible interconnection patterns between the input ports and the output ports of the selector switch. Full connectivity between the input ports and the output ports of the selector switch may be realized over time by cycling through the subset of pre-configured interconnection patterns. The subset of pre-configured interconnection patterns may be pre-configured by, for example, at least selecting some but not all of the switching elements required to fully interconnect the input ports and the output ports of the apparatus. Alternatively and/or additionally, the subset of pre-configured interconnection patterns may be pre-configured based on an arrangement of one or more electrically conductive wires, optical waveguides, fiber optic cables, and/or passive optical elements.

In some example embodiments, the selector switch may be configured to switch only between a subset of all possible interconnection patterns between the input ports and the output ports of the selector switch. By contrast, a crossbar switch may be configured to switch between the full set of all possible interconnection patterns between the input ports and the output ports of the crossbar switch. As such, the selector switch may be less expensive to construct, consume less power, switch faster, and/or provide more ports than a crossbar switch. Furthermore, because the selector switch may be configured to switch only between a subset of all possible interconnection patterns, a controller for controlling the operations of the selector switch, for example by generating the control signals for switching between interconnection patterns, may be substantially simpler and/or less expensive to construct than a controller for a crossbar switch.

FIG. 1 depicts a schematic diagram illustrating a fully configurable crossbar switch 100, in accordance with some example embodiments. Referring to FIG. 1, the crossbar switch 100 may be used to implement a conventional computing network having a fully interconnected network topology.

As shown in FIG. 1, the crossbar switch 100 may include an $N^2$ quantity of switching elements for interconnecting an N quantity of input ports with an N quantity of output ports. The crossbar switch 100 may provide an N! quantity of interconnection patterns, which may fully interconnect the N quantity of input ports with the N quantity of output ports.

Referring again to FIG. 1, the crossbar switch 100 may be controlled via an $N^2$ quantity control signals. Each one of the $N^2$ quantity control signals may control a corresponding one of the $N^2$ quantity of switching elements. For example, the control signals may toggle one or more of the $N^2$ quantity of switching elements to form any one of the N! quantity of interconnection patterns between the N quantity of input ports with the N quantity of output ports. It should be appreciated that the $N^2$ quantity of switching elements may be toggled to form a direct connection between any one of the N quantity of input ports with the N quantity of output ports. However, as the quantity of input ports and output ports increases, the quantity of switching elements required to implement the crossbar switch 100 may increase exponentially.

In some example embodiments, a selector switch may be configured to switch between a quantity of pre-configured interconnection patterns forming a subset of all possible interconnection patterns. At any given instant in time, the selector switch may not be fully interconnected as the selector switch provides only a subset of all of the possible interconnections. However, the selector switch can effectively, over time and using a sequence of interconnection patterns, provide a fully interconnected network topology. As noted, this subset of pre-configured interconnection patterns may include some but not all of the N! possible interconnection patterns between the input ports and output ports of the selector switch. As such, in some example embodiments, the selector switch may be implemented using fewer switching elements than a crossbar switch such as, for example, the crossbar switch 100. Alternatively and/or additionally, the selector switch may be implemented using beam steering switching elements that steer to fewer directions than those used to implement a crossbar switch.

Figure 2A:
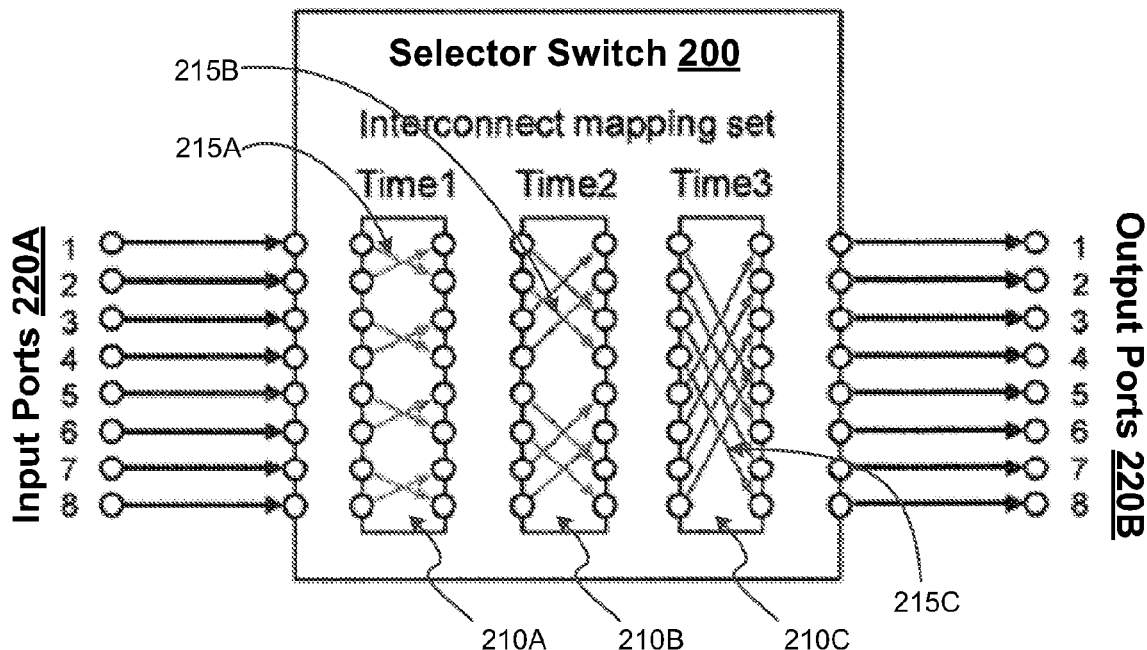
FIG. 2A depicts a selector switch, in accordance with some example embodiments.

To further illustrate, FIG. 2A depicts a selector switch 200, in accordance with some example embodiments. Referring to FIG. 2, the selector switch 200 may be configured to interconnect a plurality of input ports 220A with a plurality of output ports 220B by at least switching between a plurality of interconnection patterns including, for example, a first interconnection pattern 210A at a first time $\tau_1$, then a second interconnection pattern 210B at a second time $\tau_2$, and then a third interconnection pattern 210C at a third time $\tau_3$.

The first interconnection pattern 210A, the second interconnection pattern 210B, and the third interconnection pattern 210C may form a subset of some but not all of the possible interconnection patterns between the input ports 220A and the output ports 220B. For example, an N! quantity of interconnection patterns may be possible between an N quantity of input ports with an N quantity of output ports. However, the first interconnection pattern 210A, the second interconnection pattern 210B, and the third interconnection pattern 210C may provide three interconnection patterns, which is fewer than the N! quantity of possible interconnection patterns. In some example embodiments, k may be equal to $\log_2 N$. Alternatively and/or additionally, k may be less than or equal to N.

Referring again to FIG. 2A, the selector switch 200 may be configured to switch between the first interconnection pattern 210A, the second interconnection pattern 210B, and the third interconnection pattern 210C. For instance, as shown in FIG. 2A, the selector switch 200 may switch to the first interconnection pattern 210A at a first time $\tau_1$, the second interconnection pattern 210B at a second time $\tau_2$, and the third interconnection pattern 210C at a third time $\tau_3$.

Figure 2B:
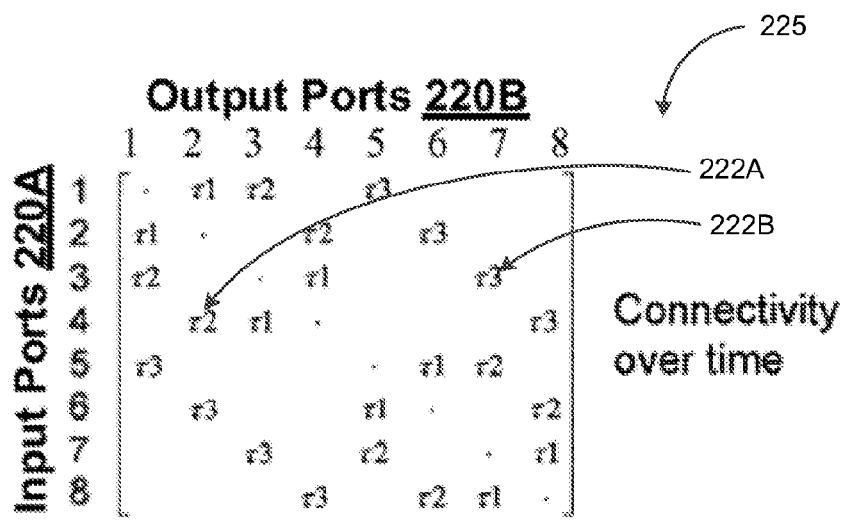
FIG. 2B depicts a matrix illustrating the connectivity of a selector switch over time, in accordance with some example embodiments.

To further illustrate, FIG. 2B depicts a matrix 225 illustrating the connectivity of the selector switch 200 over time, in accordance with some example embodiments. The value for each element in the matrix 225 may indicate the time at which a connection exists between a corresponding pair of input port and output port. For instance, a first element 222A may be associated with the value $\tau_2$ indicating that input port 4 and output port 2 are connected at the second time $\tau_2$. Meanwhile, a second element 222B may be associated with the value $\tau_3$ indicating that input port 3 and output port 7 are connected at the third time $\tau_3$.

As the matrix 225 indicates, at the first time $\tau_1$, the first interconnection pattern 210A may provide direct connections between input port 1 and output port 2, input port 2 and output port 1, input port 3 and output port 4, input port 4 and output port 3, input port 5 and output port 6, input port 6 and output port 5, input port 7 and output port 8, and output port 8 and input port 7. Meanwhile, at the second time $\tau_2$, the second interconnection pattern 210B may provide direction connections between input port 1 and output port 3, input port 2 and output port 4, input port 3 and output port 1, input port 4 and output port 2, input port 5 and output port 7, input port 6 and output port 8, input port 7 and output port 5, and input port 8 and output port 6. Alternatively and/or additionally, at the third time $\tau_3$, the third interconnection pattern 210C may provide direct connections between input port 1 and output port 5, input port 2 and output port 6, input port 3 and output port 7, input port 4 and output port 8, input port 5 and output port 1, input port 6 and output port 2, input port 7 and output port 3, and input port 8 and output port 4.

In some example embodiments, full connectivity between the input ports 220A and the output ports 220B may be realized over time by cycling through the first interconnection pattern 210A, the second interconnection pattern 210B, and/or the third interconnection pattern 210C. The first interconnection pattern 210A, the second interconnection pattern 210B, and/or the third interconnection pattern 210C may provide direct connections between at least some of the input ports 220A and the output ports 220B of the selector switch 200.

Alternatively and/or additionally, the first interconnection pattern 210A, the second interconnection pattern 210B, and/or the third interconnection pattern 210C may also provide indirect connections between the input ports 220A and/or the output ports 220B. As used herein, an indirect connection between an input port and an output port may include at least one hop through one or more intermediary input ports and/or output ports. It should be appreciated that an indirect connection between an input port and an output port may include a maximum N quantity of hops. To further illustrate, as shown in FIGS. 2A-B, the first interconnection pattern 210A, the second interconnection pattern 210B, and the third interconnection pattern 210C may each provide an indirect connection between input port 1 to output port 8, which may include one or more hops through intermediary input ports and/or output ports.

For instance, the indirect connection between input port 1 and output port 8 may include a plurality of intermediary ports including, for example, output port 2 and input port 4. To further illustrate, the first interconnection pattern 210A may include a first direct connection 215A between input port 1 and output port 2. Thus, at the first time $\tau_1$, information may be transferred, via the first direct connection 215A, from input port 1 to output port 2. This information may be stored at output port 2 until the second time $\tau_2$. Meanwhile, the second interconnection pattern 210B may provide a second direct connection 215B between output port 2 and input port 4. At the second time $\tau_2$, the information stored at output port 2 may be transferred, via the second direct connection 215B, from output port 2 to input port 4. The information may again be stored at input port 4 until the third time $\tau_3$. Referring again to FIG. 2A, the third interconnection pattern 210C may provide a third direct connection 215C between input port 4 and output port 8. Accordingly, the third time $\tau_3$, the information stored at input port 4 may be transferred, via the third direct connection 215C, from input port 4 to output port 8. It should be appreciated that at least some of the input ports 220A and/or the output ports 220B may include memory for storing information that is being conveyed through an indirect connection between an input port and an output port.

Figure 2C:
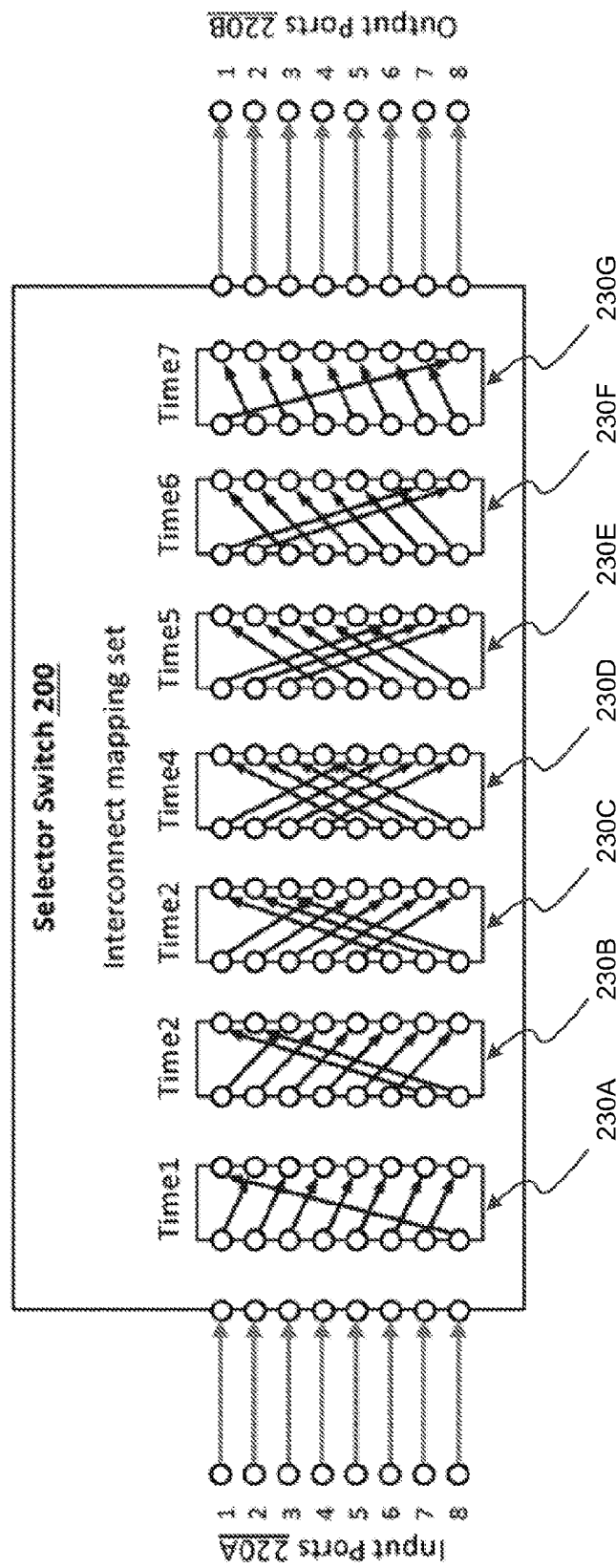
FIG. 2C depicts an alternative configuration for a selector switch, in accordance with some example embodiments.

FIG. 2C depicts an alternative configuration for the selector switch 200, in accordance with some example embodiments. Referring to FIG. 2C, the selector switch 200 may be configured to switch between a different set of pre-configured interconnection patterns including, for example, a fourth interconnection pattern 230A, a fifth interconnection pattern 230B, a sixth interconnection pattern 230C, a seventh interconnection pattern 230D, an eighth interconnection pattern 230E, a ninth interconnection pattern 230F, and/or a tenth interconnection pattern 230G. The fourth interconnection pattern 230A, the fifth interconnection pattern 230B, the sixth interconnection pattern 230C, the seventh interconnection pattern 230D, the eighth interconnection pattern 230E, the ninth interconnection pattern 230F, and/or the tenth interconnection pattern 230G may include a different subset of interconnections between the input ports 220A and the output ports 220B than the first interconnection pattern 210A, the second interconnection pattern 210B, and/or the third interconnection pattern 210C.

Figure 2D:
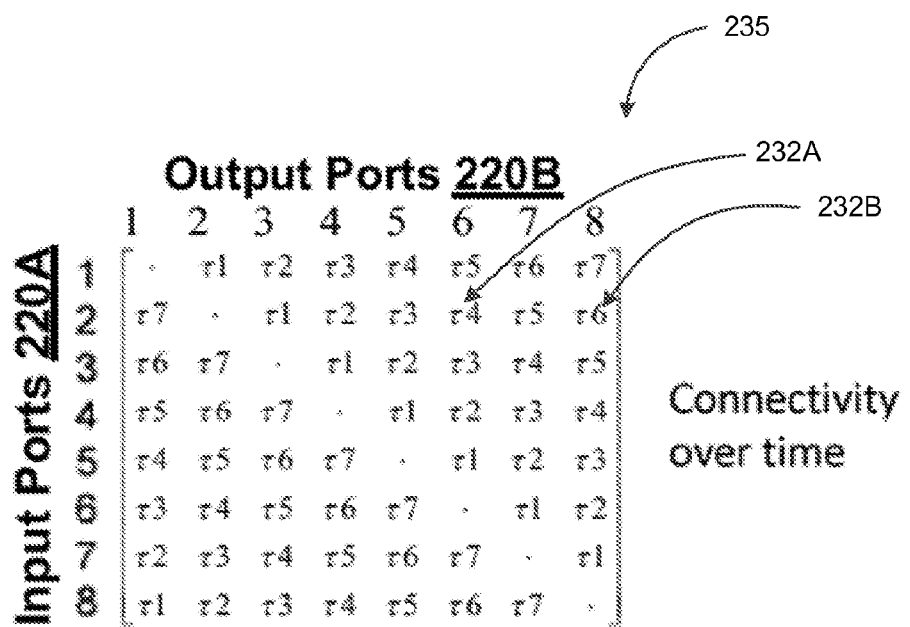
FIG. 2D depicts matrix illustrating the connectivity of a selector switch over time, in accordance with some example embodiments.

To further illustrate, FIG. 2D depicts a matrix 235 illustrating the connectivity provided by the selector switch 200 by switching to the fourth interconnection pattern 230A at the first time $\tau_1$, the fifth interconnection pattern 230B at the second time $\tau_2$, the sixth interconnection pattern 230C at the third time $\tau_3$, the seventh interconnection pattern 230D at the fourth time $\tau_4$, the eighth interconnection pattern 230E at the fifth time $\tau_5$, the ninth interconnection pattern 230F at the sixth time $\tau_6$, and/or the tenth interconnection pattern 230G at the seventh time $\tau_7$. The value for each element in the matrix 235 may indicate the time at which a connection exists between a corresponding pair of input port and output port. For instance, a first element 232A may be associated with the value $\tau_4$ indicating that input port 2 and output port 6 are connected at the fourth time $\tau_4$. Meanwhile, a second element 232B may be associated with the value $\tau_6$ indicating that input port 2 and output port 8 are connected at the sixth time $\tau_6$.

It should be appreciated that full connectivity between the input ports 220A and the output ports 220B may be realized over time by cycling through the fourth interconnection pattern 230A, the fifth interconnection pattern 230B, the sixth interconnection pattern 230C, the seventh interconnection pattern 230D, the eighth interconnection pattern 230E, the ninth interconnection pattern 230F, and/or the tenth interconnection pattern 230G.

In some example embodiments, a direct connection between all of the input ports 220A and the output ports 220B of the selector switch 200 may be achieved by cycling in time through the fourth interconnection pattern 230A, the fifth interconnection pattern 230B, the sixth interconnection pattern 230C, the seventh interconnection pattern 230D, the eighth interconnection pattern 230E, the ninth interconnection pattern 230F, and the tenth interconnection pattern 230G. In the configuration of the selector switch 200 shown in FIG. 2C, full connectivity may be achieved without requiring any indirect connections which, as noted, may include hops through one or more intermediary input ports and/or output ports. However, it should be appreciated that while cycling in time through the interconnection patterns shown in FIG. 2C may achieve full connectivity without any indirect connections, indirect connections may nevertheless exist and may be used to connect one or more input ports 220A and output ports 220B instead of and/or in addition to the direct connections.

Figure 3A:
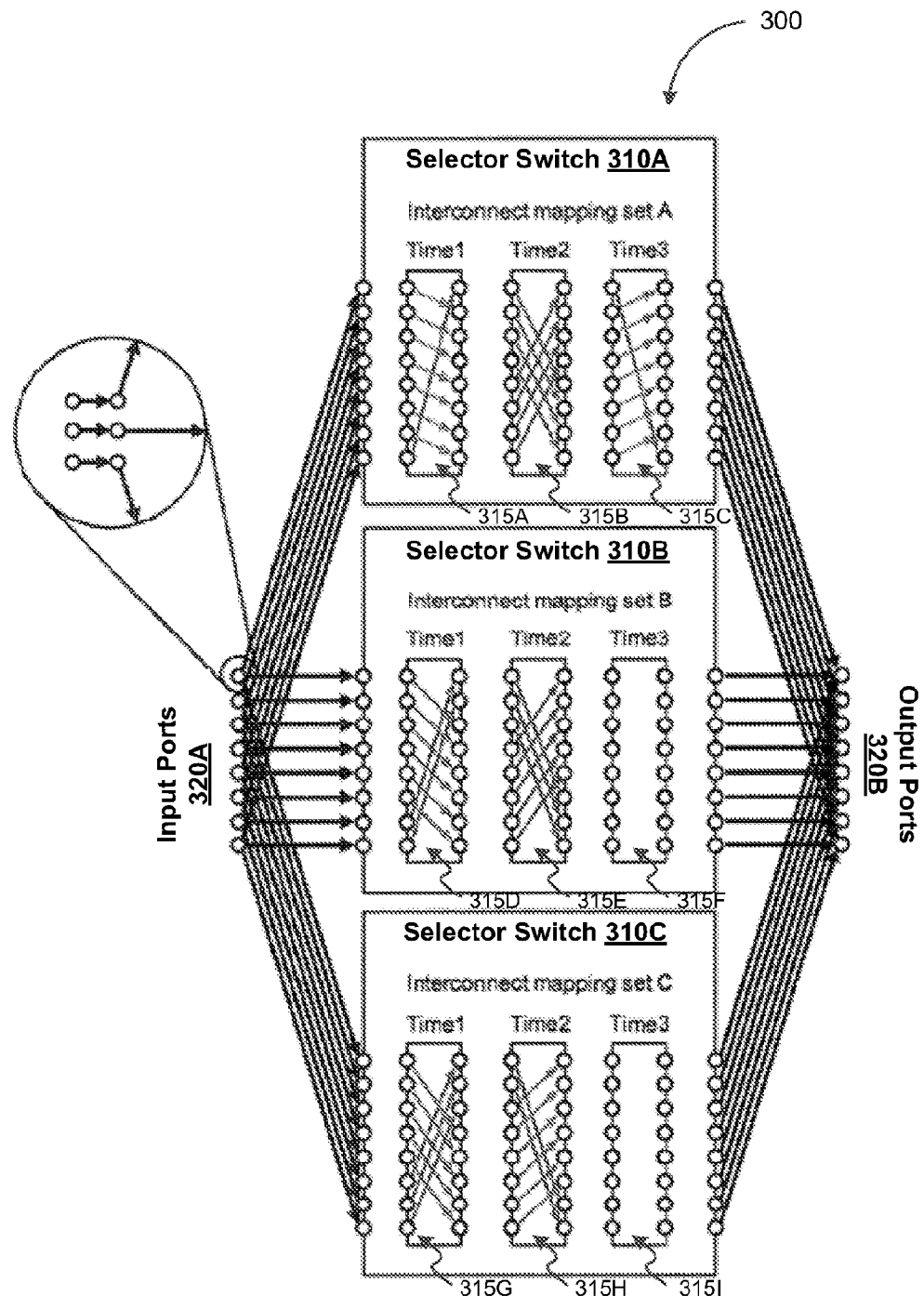
FIG. 3A depicts an aggregate selector switch, in accordance with some example embodiments.

In some example embodiments, an aggregate selector switch may be formed from one or more individual selector switches. To further illustrate, FIG. 3A depicts an aggregate selector switch 300, in accordance with some example embodiments. Referring to FIG. 3A, the aggregate selector switch 300 may include a plurality of input ports 320A and a plurality of output ports 320B. Furthermore, in the configuration shown in FIG. 3A, the aggregate selector switch 300 may include a plurality of selector switches for providing the connectivity between the input ports 320A and the output ports 320B. For instance, as shown in FIG. 3A, the aggregate selector switch 300 may include a first selector switch 310A, a second selector switch 320B, and a third selector switch 310C. Each of the input ports 320A may be coupled with a corresponding input port in each of the first selector switch 310A, the second selector switch 310B, and the third selector switch 310C. Similarly, each of the output ports 320B may also be coupled with a corresponding output port in each of the first selector switch 310A, the second selector switch 320B, and the third selector switch 310C.

It should be understood that each of the input ports 320A and each of the output ports 320B of the aggregate selector switch 300 may form logically-independent communication channels. Each logically-independent communication channel may correspond to a connection between a port in the aggregate selector switch 300 and a port in one of the plurality of selector switches. To further illustrate, in the example shown in FIG. 3A, a given input port 320A of the aggregate selector switch 300 may have three logically-independent communication channels, one to the first selector switch 310A, one to the second selector switch 310B, and one to the third selector switch 310C. Likewise, a given output port 320B of the aggregate switch 300 may also have a logically independent communication channel to each one to the first selector switch 310A, the second selector switch 310B, and the third selector switch 310C.

In some example embodiments, each of the first selector switch 310A, the second selector switch 310B, and the third selector switch 310B may be configured to interconnect the input ports 320A and the output ports 320B by switching between a plurality of interconnection patterns. As shown in FIG. 3A, each of the first selector switch 310A, the second selector switch 310B, and the third selector switch 310B may switch between different sets of interconnection patterns. For example, the first selector switch 310A may be configured to switch to a first interconnection pattern 315A at a first time $\tau_1$, a second interconnection pattern 315B at a second time $\tau_2$, and a third interconnection pattern 315C at a third time $\tau_3$. Meanwhile, the second selector switch 310B may be configured to switch to a fourth interconnection pattern 315D at the first time $\tau_1$, a fifth interconnection pattern 315E at the second time $\tau_2$, and a sixth interconnection pattern 315F at the third time $\tau_3$. Alternatively and/or additionally, the third selector switch 310C may be configured to switch to a seventh interconnection pattern 315G at the first time $\tau_1$, an eighth interconnection pattern 315H at the second time $\tau_2$, and a ninth interconnection pattern 315I at the third time $\tau_3$.

The first interconnection pattern 315A, the second interconnection pattern 315B, the third interconnection pattern 315C, the fourth interconnection pattern 315D, the fifth interconnection pattern 315E, the sixth interconnection pattern 315F, the seventh interconnection pattern 315G, the eighth interconnection pattern 315H, and/or the ninth interconnection pattern 315I may provide direct connections and/or indirect connections between the input ports 320A and the output ports 320B. As noted, the interconnection patterns in each selector switch may form a subset of all of the possible interconnection patterns between the input ports 320A and the output ports 320B. Meanwhile, full interconnectivity between the input ports 320A and the output ports 320B may be achieved over time, for example, as each of first selector switch 310A, the second selector switch 310B, and/or the third selector switch 310C cycles through a respective set of interconnection patterns. To further illustrate, FIG. 3B depicts matrices illustrating the connectivity of the aggregate selector switch 300, in accordance with some example embodiments.

Figure 3B:
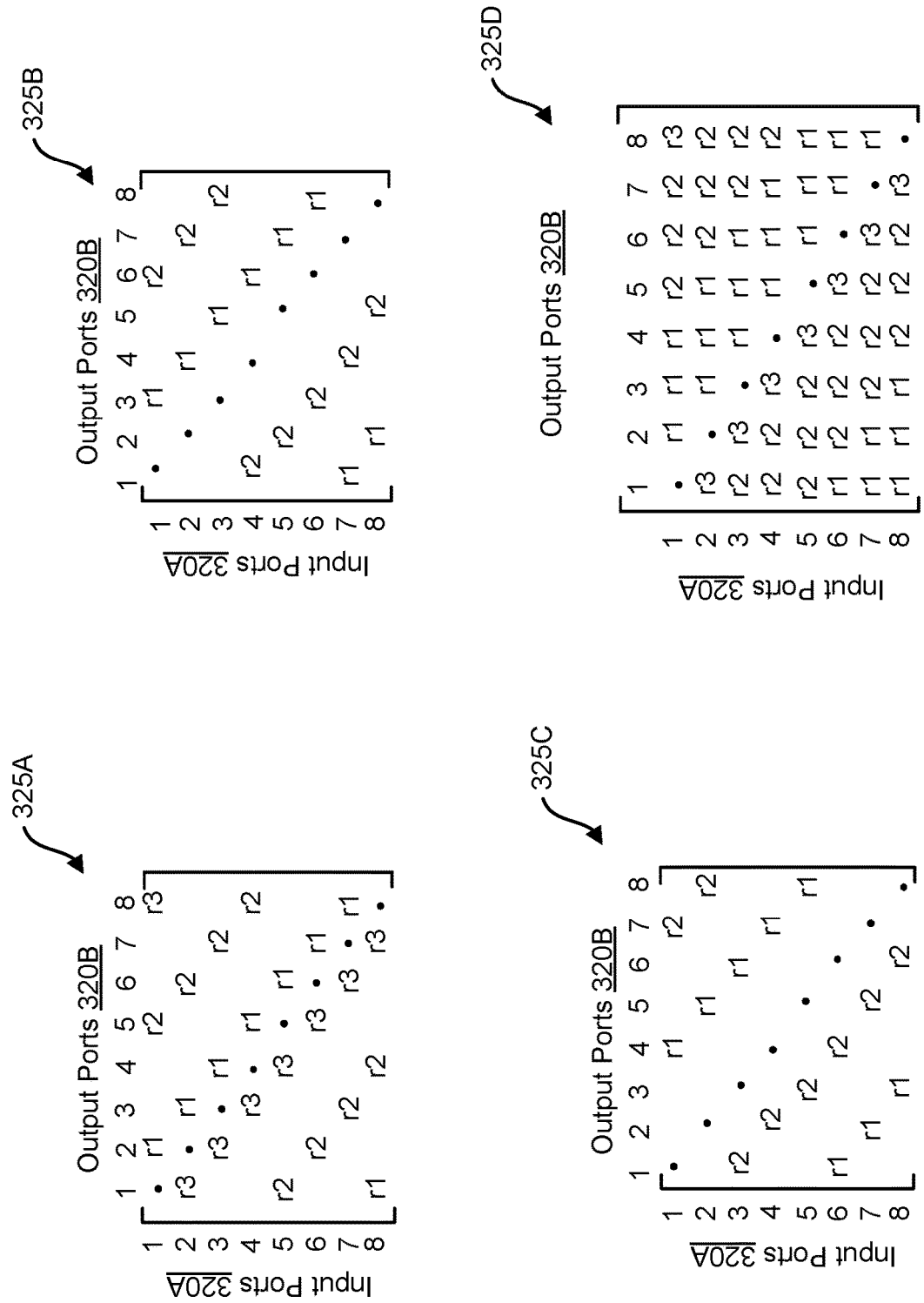
FIG. 3B depicts matrices illustrating the connectivity of an aggregate selector switch, in accordance with some example embodiments.

Referring to FIG. 3B, a first matrix 325A may depict the connectivity provided by the first selector switch 310A at the first time $\tau_1$, the second time $\tau_2$, and the third time $\tau_3$. A second matrix 325B may depict the connectivity provided by the second selector switch 310B at the first time $\tau_1$, the second time $\tau_2$, and the third time $\tau_3$. A third matrix 325C may depict the connectivity provided by the third selector switch 310C at the first time $\tau_1$, the second time $\tau_2$, and the third time $\tau_3$. Meanwhile, a fourth matrix 325D may depict the overall connectivity of the aggregate selector switch 300 at the first time $\tau_1$, the second time $\tau_2$, and the third time $\tau_3$. As shown in FIG. 3B, the fourth matrix 325D may be an aggregate of the first matrix 325A, the second matrix 325B, and the third matrix 325C because the overall connectivity of the aggregate selector switch 300 may be a combination of the individual connectivity provided by each of the first selector switch 310A, the second selector switch 310B, and the third selector switch 310C. The value of each element in the first matrix 325A, the second matrix 325B, the third matrix 325C, and/or the fourth matrix 325D may indicate the time at which a connection exists between a corresponding pair of input port and output port.

According to some example embodiments, the selector switches forming the aggregate selector switch 300 may be configured to operate in parallel. That is, the first selector switch 310A, the second selector switch 310B, and the third selector switch 310B may be simultaneously switching from one interconnection pattern to a next interconnection pattern. For instance, at the first time $\tau_1$, the first selector switch 310A may be switched to the first interconnection pattern 315A, the second selector switch 310B may be switched to the fourth interconnection pattern 315D, and the third selector switch 310C may be switched to the seventh interconnection pattern 315G. In doing so, the aggregate selector switch 300 may provide a greater overall connectivity at the first time $\tau_1$ than any individual selector switch operating independently. Furthermore, the aggregate selector switch 300 may be able to cycle through a larger quantity of interconnection patterns and/or achieve full connectivity over a shorter period of time than any individual selector switch operating alone.

Figure 3C:
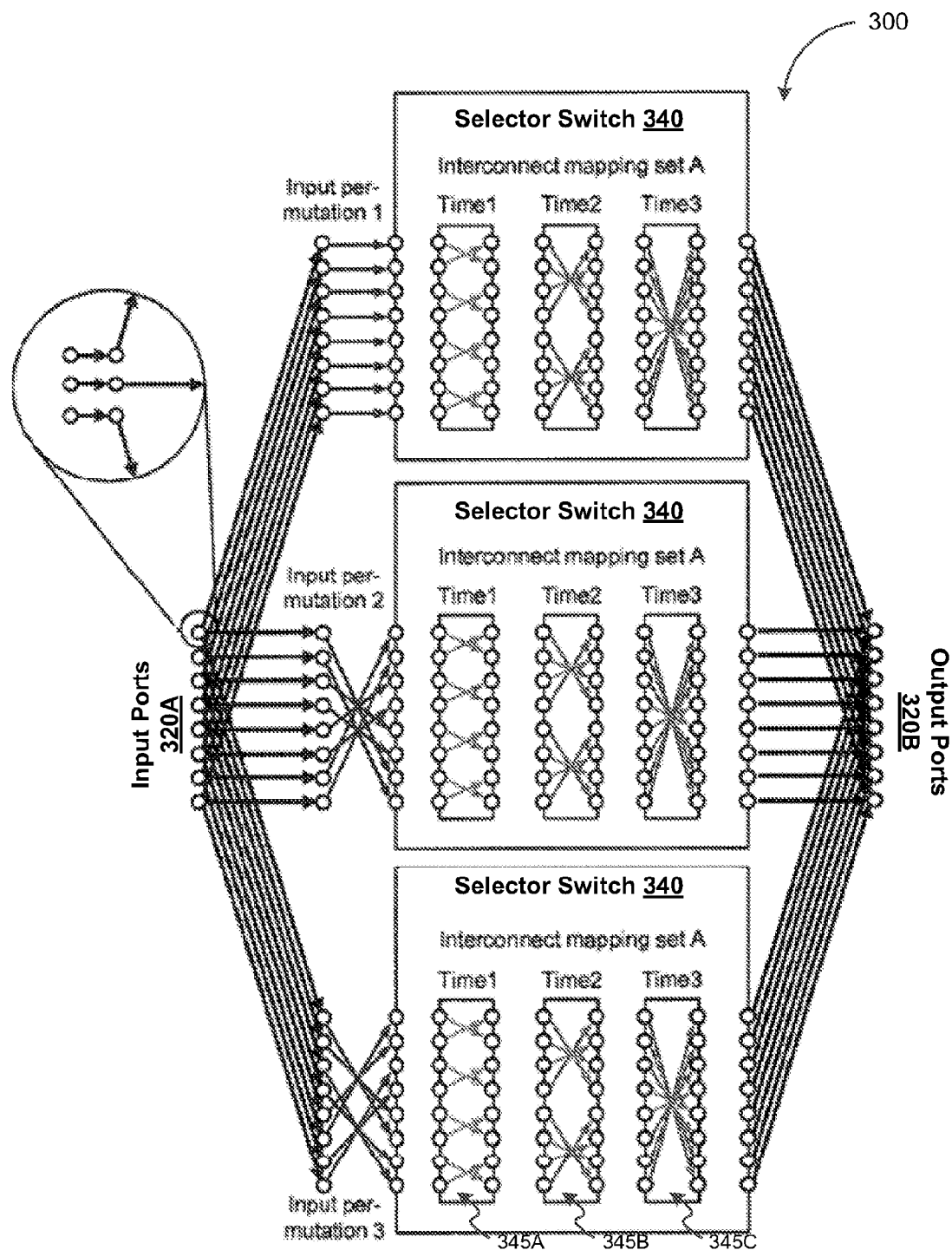
FIG. 3C depicts an alternative configuration for an aggregate selector switch, in accordance with some example embodiments.

FIG. 3C depicts an alternative configuration for the aggregate selector switch 300, in accordance with some example embodiments. Referring to FIG. 3C, the aggregate selector switch 300 may include multiple instances of a same selector switch 340 instead of and/or in addition to a plurality of different selector switches. It should be appreciated that an aggregate selector switch implemented with multiple instances of the same selector switch may be less costly to manufacture than an aggregate selector switch implemented with different selector switches.

As shown in FIG. 3C, each instance of the selector switch 340 may be configured to switch between a same set of interconnection patterns including, for example, a first interconnection pattern 345A, a second interconnection pattern 345B, and a third interconnection pattern 345C. Nevertheless, each instance of the selector switch 340 may provide a different subset of the possible interconnection patterns between the input ports 320A and the output ports 320B because each instance of the selector switch 340 may be coupled with a different permutation of the input ports 320A.

For instance, as shown in FIG. 3C, input port 1 of the aggregate selector switch 300 may be coupled with input port 1 of the first instance of the selector switch 340, input port 7 of the second instance of the selector switch 340, and input port 6 of the third instance of the selector switch 340. Similarly, input port 2 of the aggregate switch 300 may be coupled with input port 2 of the first instance of the selector switch 340, input port 8 of the second instance of the selector switch 340, and input port 5 of the third instance of the selector switch 340. As such, despite switching between identical interconnection patterns internal to each selector switch 340, each instance of the selector switch 340 may be able to provide different interconnection patterns between input ports 320A and output ports 320B of the aggregate switch 300 at the first time $\tau_1$, the second time $\tau_2$, and/or the third time $\tau_3$.

As shown in FIG. 3C, the connections established between the input ports 320A and the output ports 320B by the interconnection patterns may be bidirectional. For example, when input port 1 is connected to output port 2, input port 2 may be connected to output port 1. To further illustrate, for example, when input port 3 is connected to output port 8, input port 8 is connected to output port 3. It should be appreciated that the bi-directionality of the connections implemented by the selector switch 340 may, for example, allow information to flow in both directions simultaneously between network nodes that are connected to ports on the selector switch.

Figure 3D:
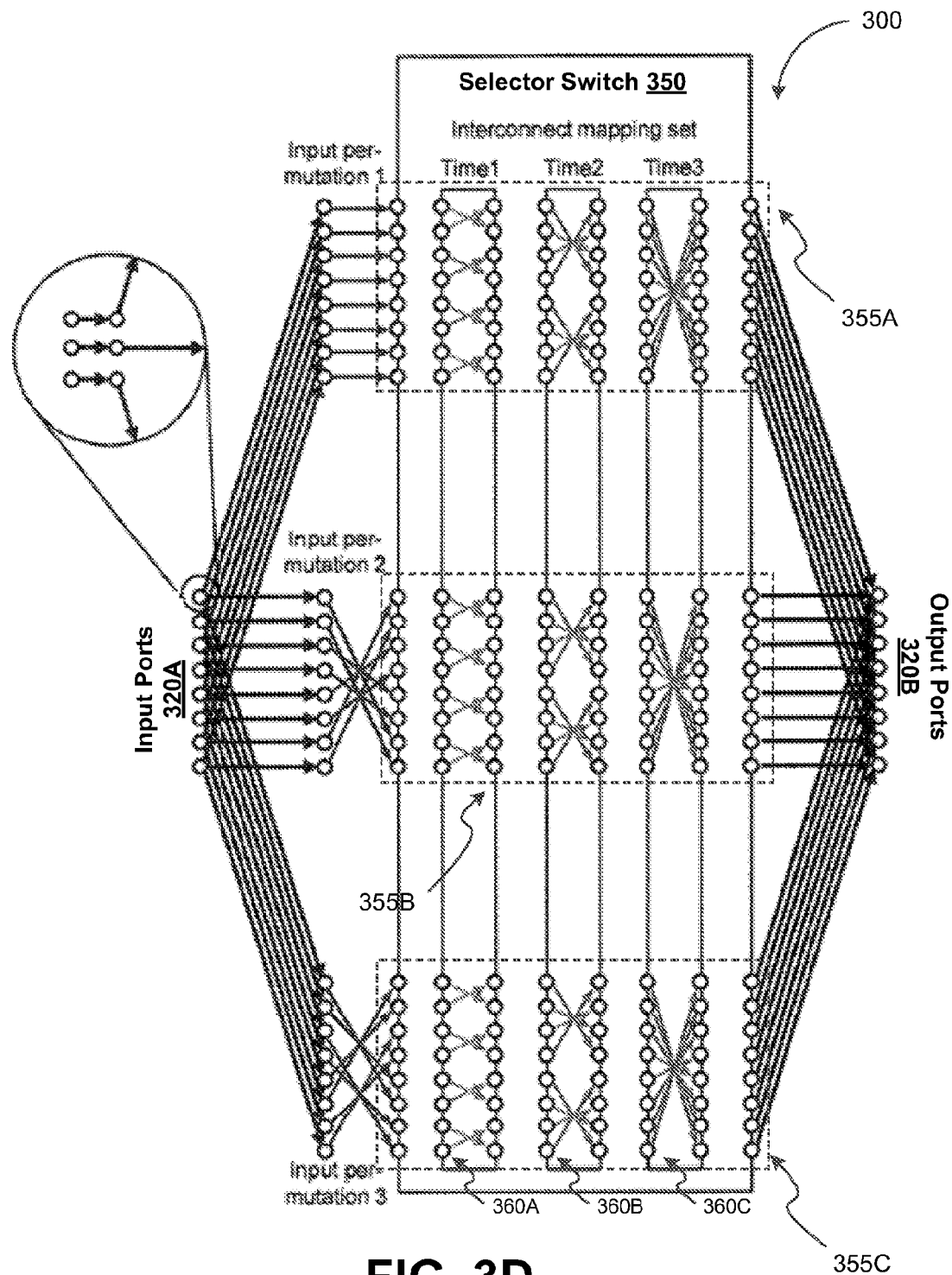
FIG. 3D depicts an alternative configuration for an aggregate selector switch, in accordance with some example embodiments.

FIG. 3D depicts an alternative configuration for the aggregate selector switch 300, in accordance with some example embodiments. Referring to FIG. 3D, the aggregate selector switch 300 may include a single selector switch 350 instead of, and/or in addition to, a plurality of different selector switches and/or multiple instances of a same selector switch. The selector switch 350 may be configured to switch between the same and/or different interconnection patterns forming a subset of all possible interconnection patterns between the input ports 320A and the output ports 320B of the selector switch 300.

The input ports and/or the output ports of the selector switch 350 may be divided into different regions including, for example, a first region 355A, a second region 355B, and/or a third region 355C. As shown in FIG. 3D, the selector switch 350 may have a total of 24 input ports and 24 output ports. As such, each of the first region 355A, the second region 355B, and the third region 355C may include 8 input ports and 8 output ports. Furthermore, the input ports in each region of the selector switch 350 may be coupled with a same and/or a different permutation of the input ports 320A. For instance, as shown in FIG. 3D, input port 1 of the aggregate selector switch 300 may be coupled with input port 1, input port 15, and input port 22 of the selector switch 350. Alternatively and/or additionally, input port 2 of the aggregate selector switch 300 may be coupled with input port 2, input port 16, and input port 21 of the selector switch 350.

In some example embodiments, each region of the selector switch 350 may be configured to cycle through a same set and/or a different set of interconnection patterns. For instance, as shown in FIG. 3D, the first region 355A, the second region 355B, and/or the third region 355C may switch to a first interconnection pattern 360A at a first time $\tau_1$, a second interconnection pattern 360B at a second time $\tau_2$, and a third interconnection pattern 360C at a third time $\tau_3$. As noted, full connectivity between the input ports 320A and the output ports 320B may be achieved over time as the first region 355A, the second region 355B, and/or the third region 355C cycles through the first interconnection pattern 360A, the second interconnection pattern 360B, and/or the third interconnection pattern 360C.

In some example embodiments, a selector switch such as, for example, the selector switch 200 and/or the aggregate selector switch 300, may be implemented as an electronic switch, an optical switch, a radio frequency switch, and/or the like.

Figure 4:
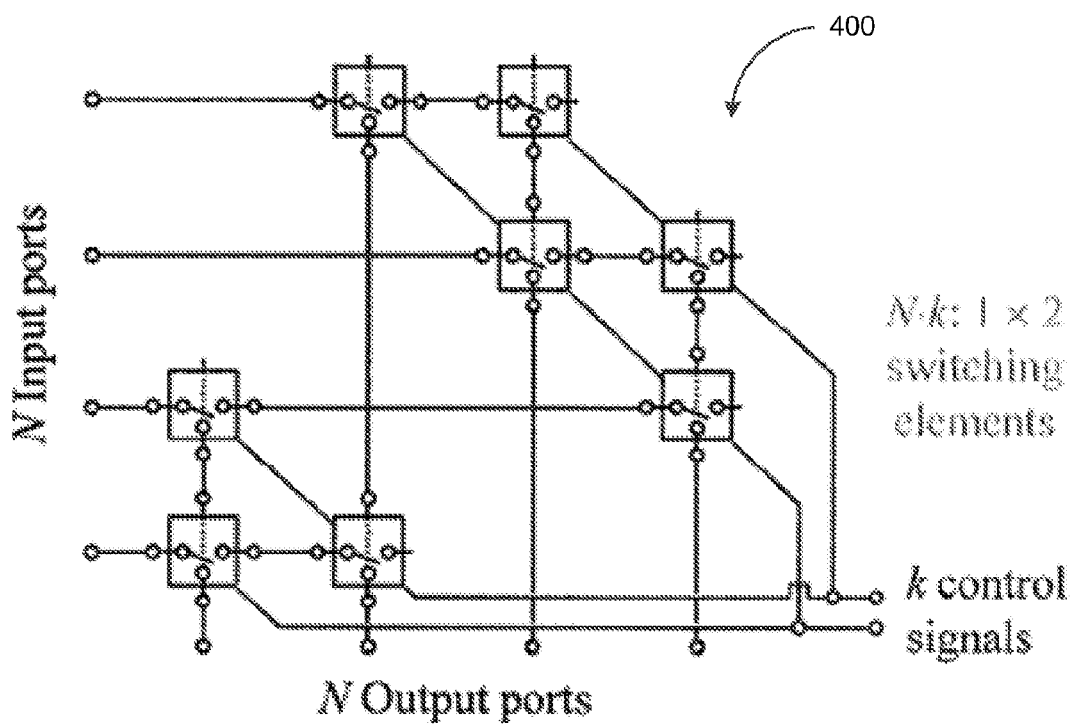
FIG. 4 depicts a schematic diagram illustrating a portion of a selector switch, in accordance with some example embodiments.

To further illustrate, FIG. 4 depicts a schematic diagram illustrating a portion of a selector switch 400. The selector switch 400 shown in FIG. 4 may be suitable for an electronic, optical, and/or radio frequency implementation due to its planar, two-dimensional geometry. Referring to FIG. 4, the selector switch 400 may include a k×N quantity of switching elements and may be controlled via a corresponding k quantity of control signals, wherein k may be less than or equal to N (e.g., k=$\log_2$ N). It should be appreciated that selector switch 400 may be implemented using fewer switching elements than the crossbar switch 100. Furthermore, it should be appreciated that the selector switch 400 may operate based on fewer than $N^2$ control signals, wherein at least some of the k×N switching elements may switch in response to a common and/or shared control signal.

In some example embodiments, the selector switch 400 may be configured to switch between a plurality of pre-configured interconnection patterns. For example, toggling one or more of the k×N quantity of switching elements may cause the selector switch 400 to form different interconnection patterns. Each interconnection pattern may be pre-configured by at least selecting a subset of some but not all of an $N^2$ quantity of switching elements required to fully interconnect the N quantity of input ports and the N quantity of output ports. The resulting k×N quantity of switching elements may provide only partial connectivity between the N quantity of input ports and the N quantity of output ports. It should be appreciated that a signal may be routed through an interconnection pattern in order to be sent between the N quantity of input ports and the N quantity of output ports. As such, toggling one or more of the k×N quantity of switching elements may cause the signal to be routed through different interconnection patterns.

In some example embodiments, irrespective of the quantity of input ports and/or output ports, each signal traversing the selector switch 400 may pass through only a single switching element in the switched state and one or more switching elements in the pass-through state. In the context of FIG. 4, a switching element in the switched state may change the direction of signal propagation, for example, from horizontal to vertical. Meanwhile, a switching element in the pass-through state may maintain the original direction of signal propagation The set of k interconnection patterns may provide a subset of the N! possible interconnection patterns between the N quantity of input ports and the N quantity of output ports. As noted, full interconnectivity between the N quantity of input ports and the N quantity of output ports may be realized over time, for example, by cycling through the plurality of pre-configured interconnection patterns. Furthermore, at least some of the N quantity of input ports may be connected to an output port via an indirect connection that includes at least one hop through one or more intermediary input ports and/or output ports. An indirect connection between an input port and an output port may include, at most, an N quantity of hops.

In the configuration shown in FIG. 4, the k×N quantity of switching elements may be configured to switch an electrical, optical, and/or radio frequency signal between the N quantity of input ports and the N quantity of output ports. It should be appreciated that a variety of different technologies may be used to implement a switching element including, for example, electronic transistors, electro-optic devices, thermo-optic devices, semiconductor amplifier devices, microelectromechanical (MEMS) actuated waveguide coupling devices, beam steering devices, and/or the like. The set of k interconnection patterns may be formed from electrically conductive wires, optical waveguides, fiber optic cables, and/or the like. Alternatively and/or additionally, the set of k interconnection patterns may be formed from an arrangement of pre-configured and/or passive optical elements including, for example, lenses, mirrors, diffraction gratings, holograms, fiber optic cables, planar waveguides, and/or the like.

As noted, the selector switch 400 may have a planar, two-dimensional geometry. However, it should be appreciated that different configurations of a selector switch may be implemented in three dimensions. These three-dimensional embodiments may be well suited to an optical implementation. To further illustrate, FIG. 5 depicts a block diagram illustrating a selector switch 500, in accordance with some example embodiments.

Figure 5:
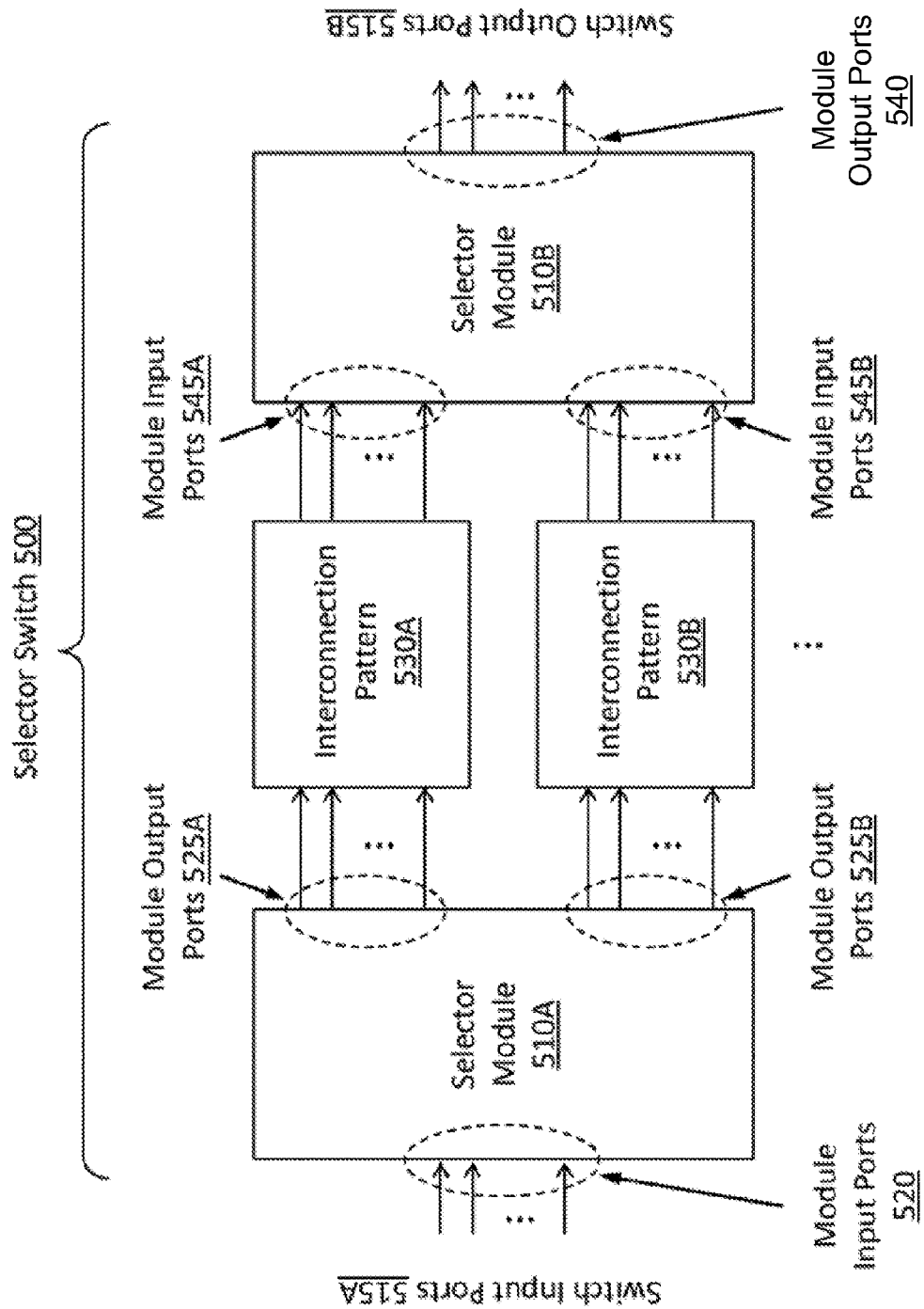
FIG. 5 depicts a block diagram illustrating a selector switch, in accordance with some other example embodiments.

Referring to FIG. 5, the selector switch 500 may include a plurality of switch input ports 515A and a plurality of switch output ports 515B. The selector switch 500 may further include one or more selector modules including, for example, a first selector module 510A and a second selector module 510B. Although the selector switch 500 is shown to include two selector modules, it should be appreciated that various embodiments of the selector switch 500 may include a different quantity of selector modules.

As shown in FIG. 5, each selector module may include a plurality of input ports and a plurality of output ports. For instance, the first selector module 510A may include a plurality of module input ports 520, a first plurality of module output ports 525A, and a second plurality of module output ports 525B. The second selector module 510B may include a first plurality of module input ports 545A, a second plurality of module input ports 545B, and a plurality of module output ports 540. As shown in FIG. 5, the selector switch 500 may further include a plurality of interconnection patterns including, for example, a first interconnection pattern 530A and a second interconnection pattern 530B.

Referring again to FIG. 5, the first selector module 510A may switch the module input ports 520 to either the module output ports 525A or the module output ports 525B. In doing so, the first selector module 510A may connect the switch input ports 515A to either the first interconnection pattern 530A or to the second interconnection pattern 530B. Again referring to FIG. 5, the second selector module 510B may switch simultaneously as the first selector module 510A in order to connect the module output ports 540 to either the module input ports 545A or to the module input ports 545B. As such, the second selector module 510B may connect the switch output ports 515B to either the first interconnection pattern 530A or to the second interconnection pattern 530B. In some example embodiments, the simultaneous switching of the first selector module 510A and the second selector module 510B may enable the transmission of signals between the switch input ports 515A and the switch output ports 515B via either the first interconnection pattern 530A or the second interconnection pattern 530B.

Figure 6A:
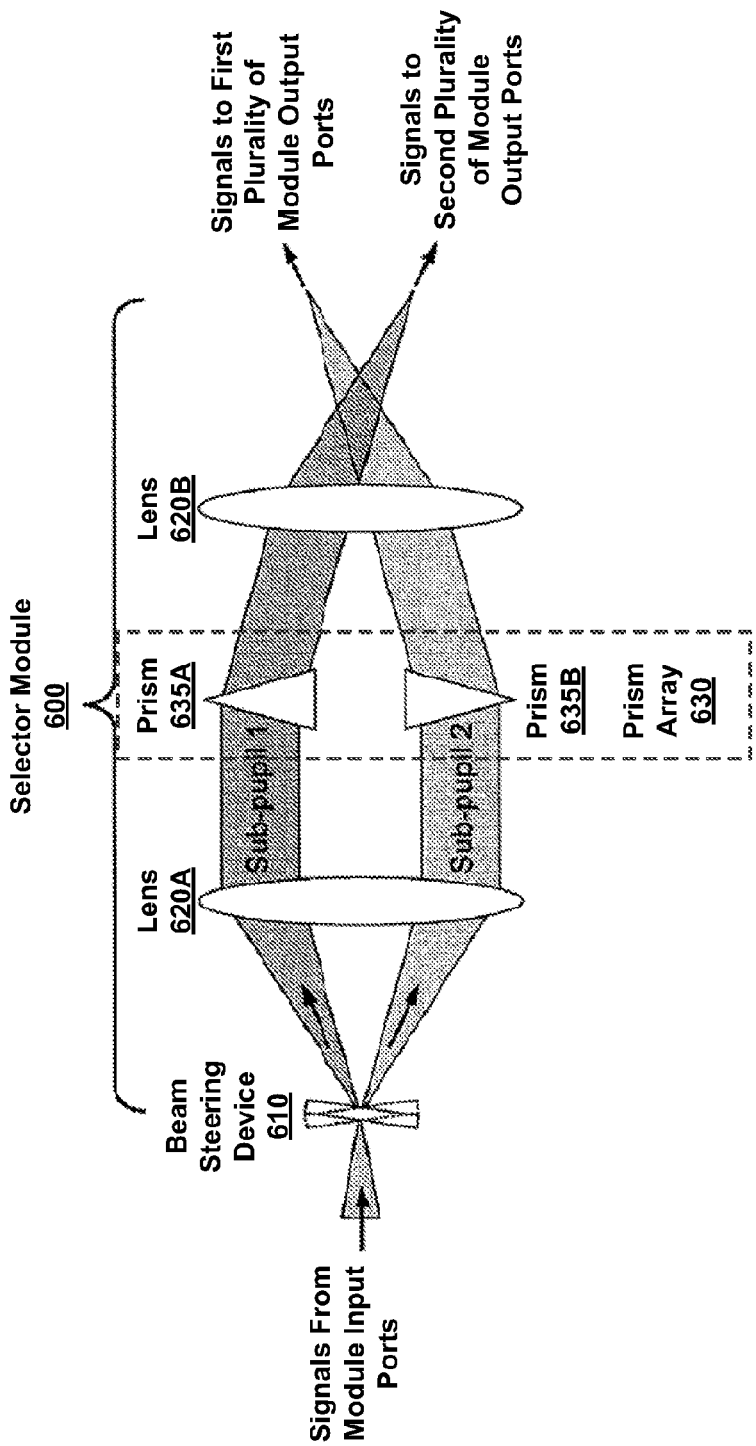
FIG. 6A depicts a selector module, in accordance with some example embodiments.

FIG. 6A depicts a selector module 600, in accordance with some example embodiments. Referring to FIGS. 5 and 6A, the selector module 600 may implement the first selector module 510A and/or the second selector module 510B forming the selector switch 500. As shown in FIG. 6A, the selector module 600 may include a beam steering device 610, a first lens 620A, a prism array 630, and a second lens 620B. In some example embodiments, the selector module 600 may be an optical switch configured to relay one or more optical signals between one or more of the N quantity of input ports of the selector module 600 and one or more of the k×N quantity of output ports of the selector module 600, where there is N quantity of input ports and N quantity of output ports of the selector switch and there is k quantity of interconnection patterns in the selector switch.

Figure 7:
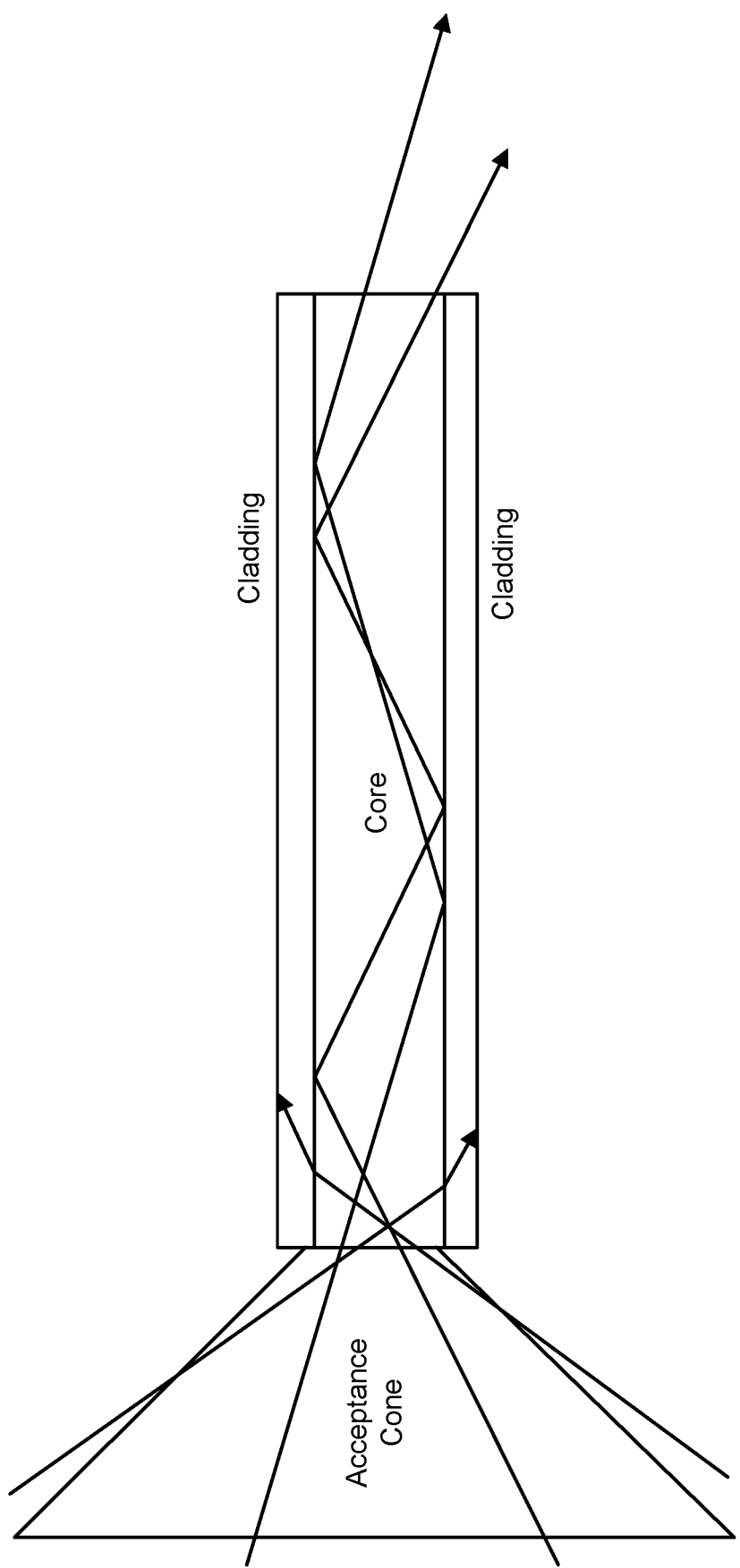
FIG. 7 depicts an acceptance cone of a fiber optic cable, in accordance with some example embodiments.

Referring again to FIG. 6A, the first lens 620A, the prism array 630, and the second lens 620B may be configured to perform an image relay of one or more signals to and/or from the beam steering device 610. For example, the input ports and/or the output ports of the selector switch 500 as well as the input ports and output ports of the selector module 600 may be formed from arrays of fiber optic cables. As shown in FIG. 7, for an optical signal to enter a fiber optic cable, the optical signal must fall within an acceptance cone of the fiber optic cable. Thus, in order to transfer one or more optical signals from one or more input ports of the selector module 600 to one or more output ports of the selector module 600, the first lens 620A, the prism array 630, and the second lens 620B may be aligned to direct the one or more optical signals within the acceptance cones of one or more output ports.

As shown in FIG. 6A, the prism array 630 may include a plurality of prisms including, for example, a first prism 635A and a second prism 635B. In some example embodiments, the first lens 620A, the first prism 635A, and the second lens 620B may be aligned with the acceptance cone of a second plurality of module output ports of the selector module 600. Alternatively and/or additionally, the first lens 620A, the second prism 635B, and the second lens 620B may be aligned with the acceptance cone of a first plurality of module output ports of the selector module 600. In some example embodiments, to transfer one or more optical signals from one or more input ports of the selector module 600 to one or more output ports of the selector module 600, the beam steering device 610 may be configured to steer the one or more optical signals onto the appropriate prism in the prism array 630.

For example, to transfer an optical signal from the module input ports of the selector module 600 to the first plurality of module output ports of the selector module 600, the beam steering device 610 may steer the optical signal onto the second prism 635B. Alternatively and/or additionally, to transfer an optical signal from the module input ports of selector module 600 to the second plurality of module output ports of the selector module 600, the beam steering device 610 may steer the optical signal onto the first prism 635A. It should be appreciated that the selector module 600 may couple one or more input ports with one or more output ports by using the beam steering device 610 to steer one or more optical signals onto the appropriate prism in the prism array 630 located within an imaging relay formed by lens 620A and 620B instead of by directing the optical signal into the acceptance cone of the output port without the use of an imaging relay. This manner of transferring the optical signal through use of an imaging relay may be more tolerant to misalignment of the beam steering device 610, for example, with respect to the acceptance cone of the output port. Furthermore, it should be appreciated that the configuration of the selector switch 600 may support changes in the direction of signal propagation between the input ports and the output ports of the selector module 600.

Figure 6B:
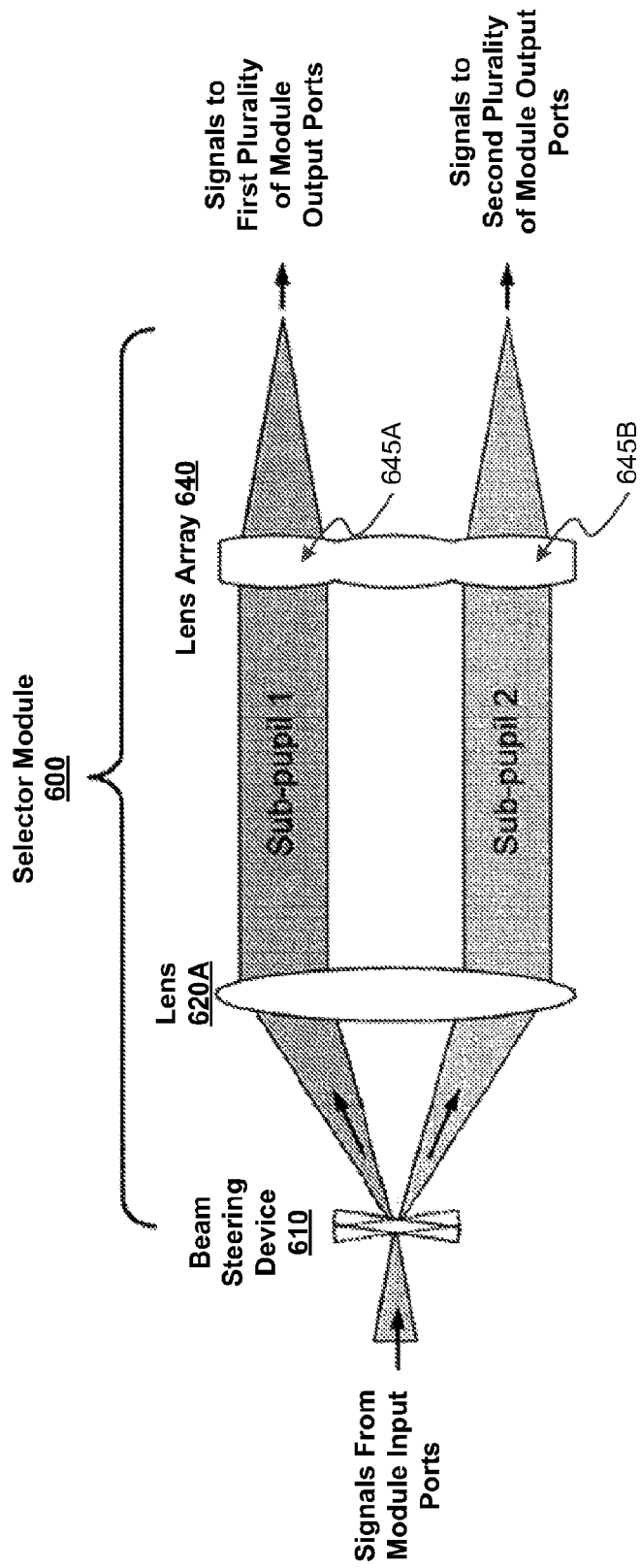
FIG. 6B depicts an alternative configuration for a selector module, in accordance with some example embodiments.

FIG. 6B depicts an alternative configuration for the selector module 600, in accordance with some example embodiments. The selector module 600 may implement the first selector module 510A and/or the second selector module 510B forming the selector switch 500. Referring to FIG. 6B, the selector module 600 may include a lens array 640 instead of and/or in addition to the prism array 630 and/or the second lens 620B. In some example embodiments, the lens array 640 may be formed from a single segmented lens having a plurality of different segments including, for example, a first segment 645A and a second segment 645B. Alternatively and/or additionally, the lens array 640 may include a plurality of separate lens.

In some example embodiments, the first lens 620A and each lens segment in the lens array 640 may be aligned with a plurality of one or more output ports of the selector module 600. For instance, as shown in FIG. 6B, the first lens 620A and the first segment 645A may be aligned with the acceptance cone of a first plurality of module output ports of the selector module 600. Alternatively and/or additionally, the first lens 620A and the second segment 645B may be aligned with the acceptance cone of a second plurality of module output ports of the selector module 600. As such, to transfer an optical signal from the input ports of the selector module 600 to the appropriate output ports of the selector module 600, the beam steering device 610 may be configured to steer the optical signal onto the appropriate lens segment in the lens array 640. For example, to transfer an optical signal from the input ports of the selector module 600 to the first plurality of module output ports, the beam steering device 610 may steer the optical signal onto the first segment 645A. Alternatively and/or additionally, to transfer an optical signal from the input ports of selector module 600 to the second plurality of module output ports of the selector module 600, the beam steering device 610 may steer the optical signal onto the second segment 645B.

It should be appreciated that the beam steering device 610 may couple one or more input ports with one or more output ports by steering an optical signal onto the appropriate lens segment in the lens array 640 instead of by directing the optical signal into the acceptance cone of the output port. This manner of transferring the optical signal may be more tolerant to misalignment of the beam steering device 610, for example, with respect to the acceptance cone of the output port. Furthermore, the configuration of the selector switch 600 shown in FIG. 6B may support changes in the direction of signal propagation between the input ports and the output ports of the selector module 600.

Figure 8A:
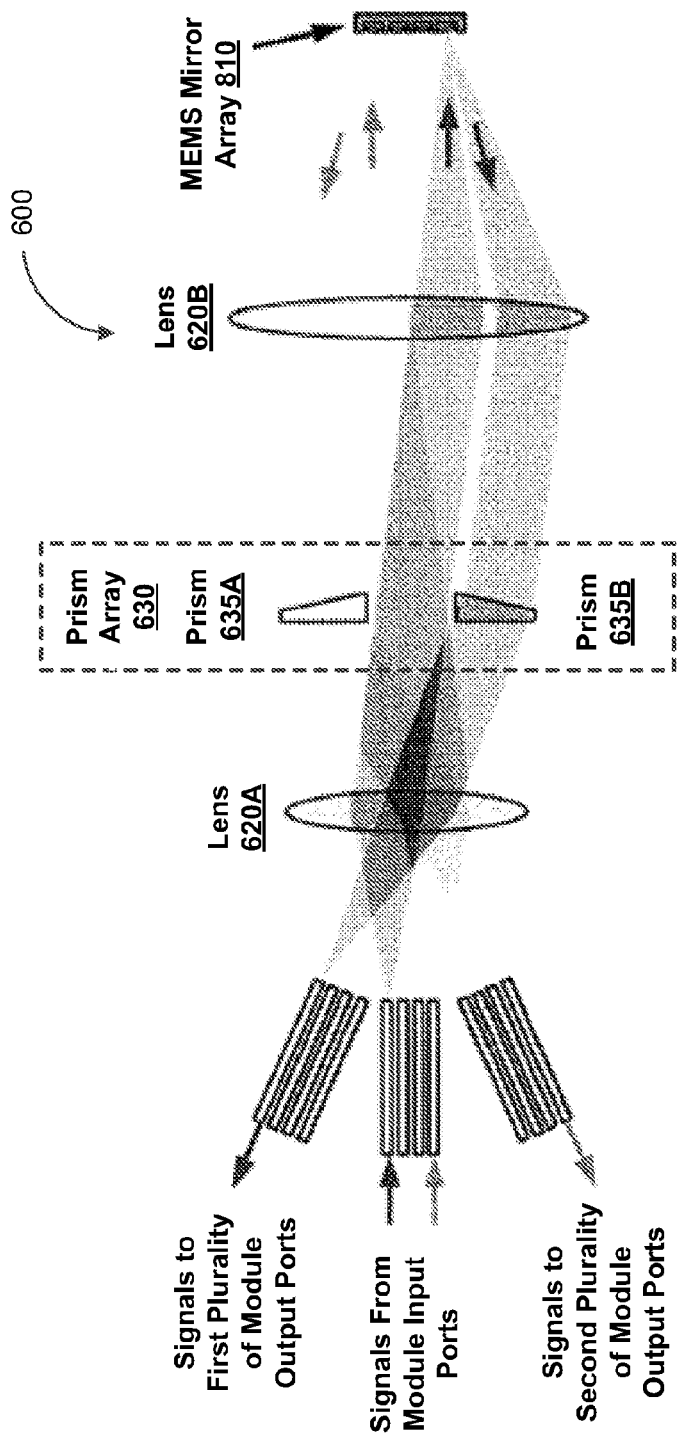
FIG. 8A depicts an alternative configuration for a selector module, in accordance with some example embodiments.

FIG. 8A depicts an alternative configuration for the selector module 600, in accordance with some example embodiments. As shown in FIG. 8A, the beam steering device 610 in the selector module 600 may be implemented using a microelectromechanical mirror array 810. In some example embodiments, the tilt of the mirrors in the microelectromechanical mirror array 810 may change in order to steer an one or more signals onto the appropriate prism in the prism array 630 for steering the optical signals between the input ports of the selector module 600 and the appropriate output ports of the selector module 600. Although not shown, it should be appreciated that the tilt of the mirrors in the microelectromechanical mirror array 810 may also change in order to steer optical signals onto appropriate lenses and/or lens segments in the lens array 640.

As noted, the selector switch 500 may be configured to cycle through different interconnection patterns. The set of interconnection patterns may provide a subset of all of the possible interconnections between the input ports and the output ports of the selector switch 500. As such, the tilt of the mirrors in the microelectromechanical mirror array 810 may change in accordance with the cycling of interconnection patterns.

To further illustrate, the selector switch 500 may switch, at a first time $\tau_1$, to a first interconnection pattern. The first interconnection pattern may require direct connections between the module input ports of the selector module 600 and a first plurality of module output ports of the selector module 600. Meanwhile, the selector switch 500 may switch to a second interconnection pattern at a second time $\tau_2$. The second interconnection pattern may require direction connections between the module input ports of the selector module 600 and a second plurality of module output ports of the selector module 600. As such, at the first time $\tau_1$, one or more mirrors in the microelectromechanical mirror array 810 may be tilted (e.g., at x degrees) in order to steer one or more optical signals onto the second prism 635B. As noted, steering the optical signals onto the second prism 635B may further direct the optical signals into the acceptance cones of the first plurality of module output ports aligned with the second prism 635B. Alternatively and/or additionally, at the second time $\tau_2$, one or more mirrors in the microelectromechanical mirror array 810 may be tilted (e.g., at y degrees) in order to steer one or more optical signals onto the first prism 635A. Steering the optical signals onto the first prism 635A may further direct the optical signals into the acceptance cones of the second plurality of module output ports.

Figure 8B:
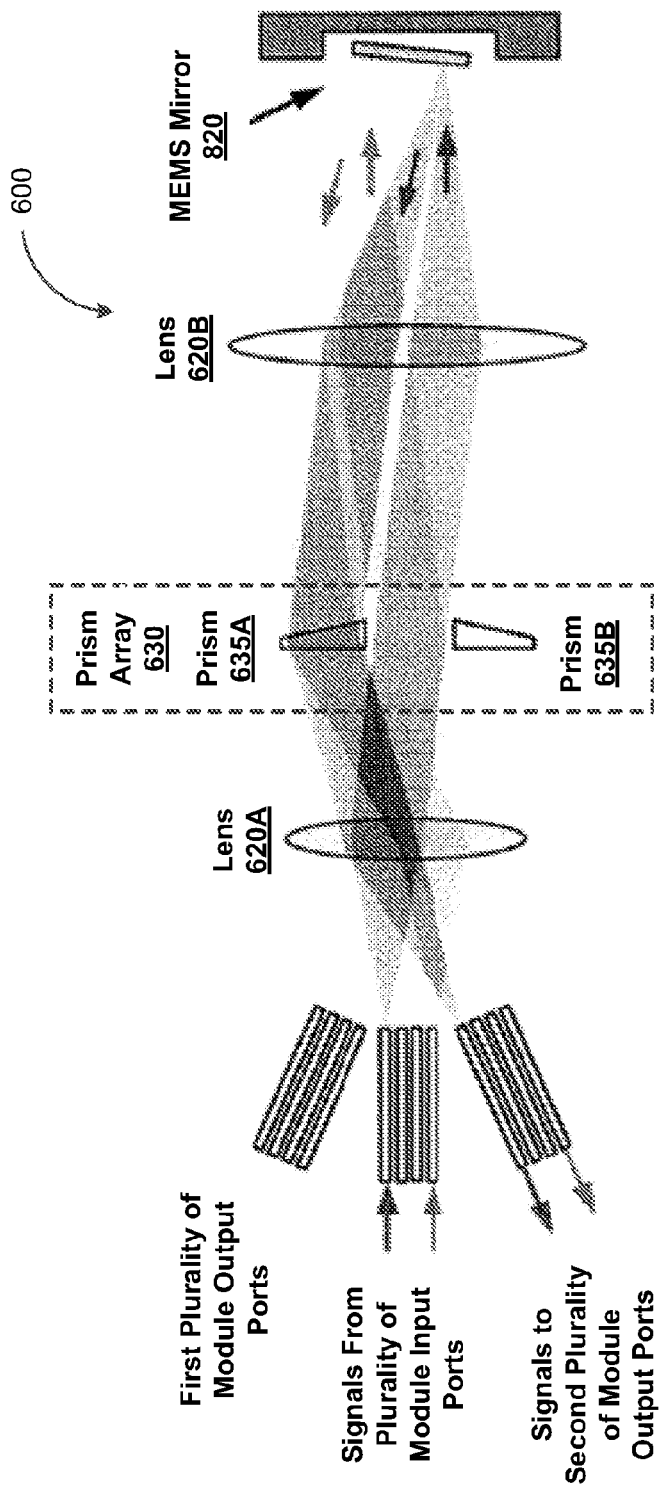
FIG. 8B depicts an alternative configuration for a selector module, in accordance with some example embodiments.

FIG. 8B depicts an alternative configuration for the selector module 600, in accordance with some example embodiments. Referring to FIG. 8B, the beam steering device 610 of the selector module 600 may be implemented using a single microelectromechanical mirror 820. In some example embodiments, the tilt of the microelectromechanical mirror 820 may change in order to steer one or more optical signals onto the appropriate prism in the prism array 630. Alternatively and/or additionally, the tilt of the microelectromechanical mirror 820 may also change in order to steer one or more optical signals onto an appropriate lens and/or lens segment in the configuration of the selector module 600 shown in FIG. 6B.

As noted, the selector switch 500 may be configured to cycle through different interconnection patterns. The set of interconnection patterns may provide a subset of all of the possible interconnections between the input ports and the output ports of the selector switch 500. Accordingly, the tilt of the microelectromechanical mirror 820 may change in accordance with the cycling of interconnection patterns.

Figure 8C:
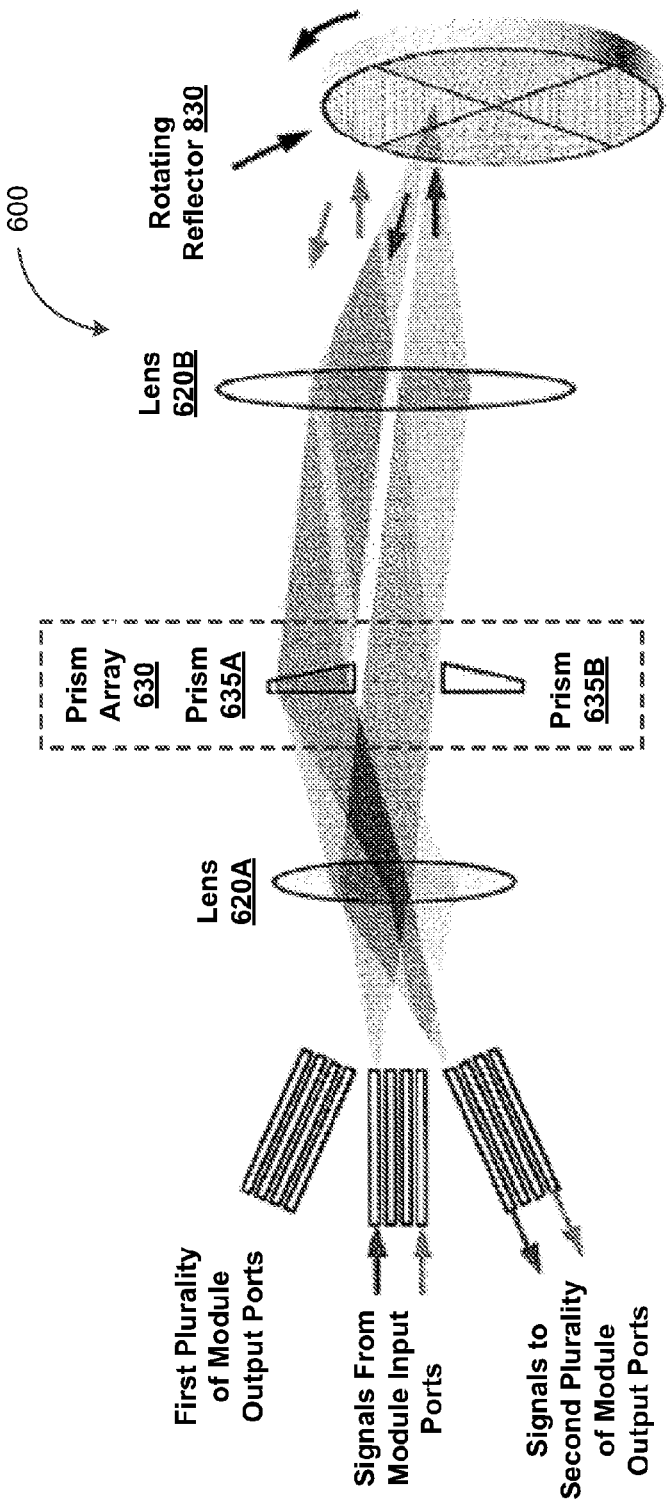
FIG. 8C depicts an alternative configuration for a selector module, in accordance with some example embodiments.

FIG. 8C depicts an alternative configuration for the selector module 600, in accordance with some example embodiments. Referring to FIG. 8C, the beam steering device 610 of the selector module 600 may be implemented using a rotating reflector 830. As shown in FIG. 8C, the rotating reflector 830 may include a plurality of reflective regions. It should be appreciated that each reflective region may be configured to steer one or more optical signals onto an appropriate prism in the prism array 630. Alternatively and/or additionally, each reflective region may be configured to steer one or more optical signals onto an appropriate lens and/or lens segment in the lens array 640. Steering optical signals onto a prism in the prism array 630 may couple an array of module input ports of the selector module 600 with a corresponding plurality of module output ports of the selector module 600. Although not pictured in FIG. 8C, it should be appreciated that a rotating optical element having refractive and/or diffractive regions in addition to and/or instead of reflective regions may also serve as the beam steering device 610.

To further illustrate, the selector switch 500 may switch, at a first time $\tau_1$, to a first interconnection pattern that requires direct connections between the module input ports of the selector module 600 and the first plurality of module output ports of the selector module 600. As such, at the first time $\tau_1$, the rotating reflector 830 may rotate to a first reflective region configured to steer one or more optical signals onto the second prism 635B in the prism array 630. Steering the optical signals onto the second prism 635B may further direct the optical signals into the acceptance cones of the first plurality of module output ports aligned with the second prism 635B. Alternatively and/or additionally, the selector switch 500 may switch, at a second time $\tau_2$, to a second interconnection pattern that requires direct connections between the input ports of the selector module 600 and the second plurality of module output ports of the selector module 600. Accordingly, at the second time $\tau_2$, the rotating reflector 830 may be configured to rotate to a second reflective region configured to steer one or more optical signals onto the first prism 635A in the prism array 630. Steering the optical signals onto the first prism 635A may further direct the optical signals into the acceptance cones of the second plurality of module output ports.

Figure 9A:
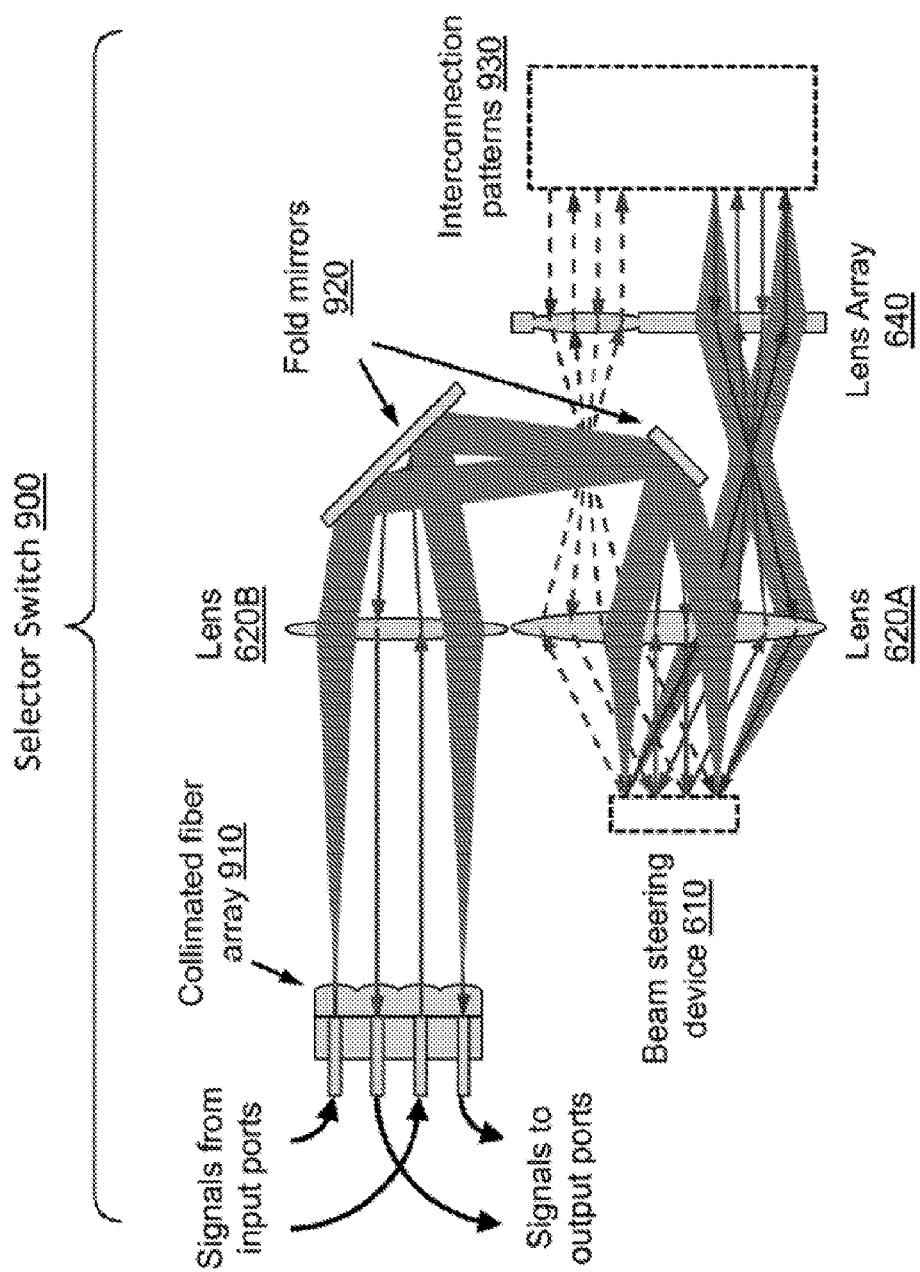
FIG. 9A depicts a selector switch, in accordance with some other example embodiments.

According to some example embodiments, a selector switch may be folded geometrically such that the selector switch may be implemented using a single selector module. FIG. 9A depicts a selector switch 900, in accordance with some example embodiments. As shown in FIG. 9A, the selector switch 900 may include a single collimated fiber array 910, which may serve as both the input ports and the output ports of the selector switch 900. It should be appreciated that using a single fiber array for both the input ports and the output ports of the folded selector switch 900 may reduce the cost of manufacture.

In some example embodiments, the selector switch 900 may include a plurality of fold mirrors 920, which may further simplify the fabrication of the selector switch 900. The fold mirrors 920 may direct optical signals between the input ports and/or the output ports of the selector switch 900 via, for example, the lens first lens 620A, the second lens 620B, the lens array 640, the beam steering device 610, and a plurality of interconnection patterns 930.

Referring again to FIG. 9A, the lens array 640 may provide a planar interface to the plurality of interconnection patterns 930. It should be appreciated that such a planar interface to the interconnection patterns 930 may further reduce the cost of manufacture by allowing the interconnection patterns 930 to be fabricated using, for example, photolithographic processes.

Figure 9B:
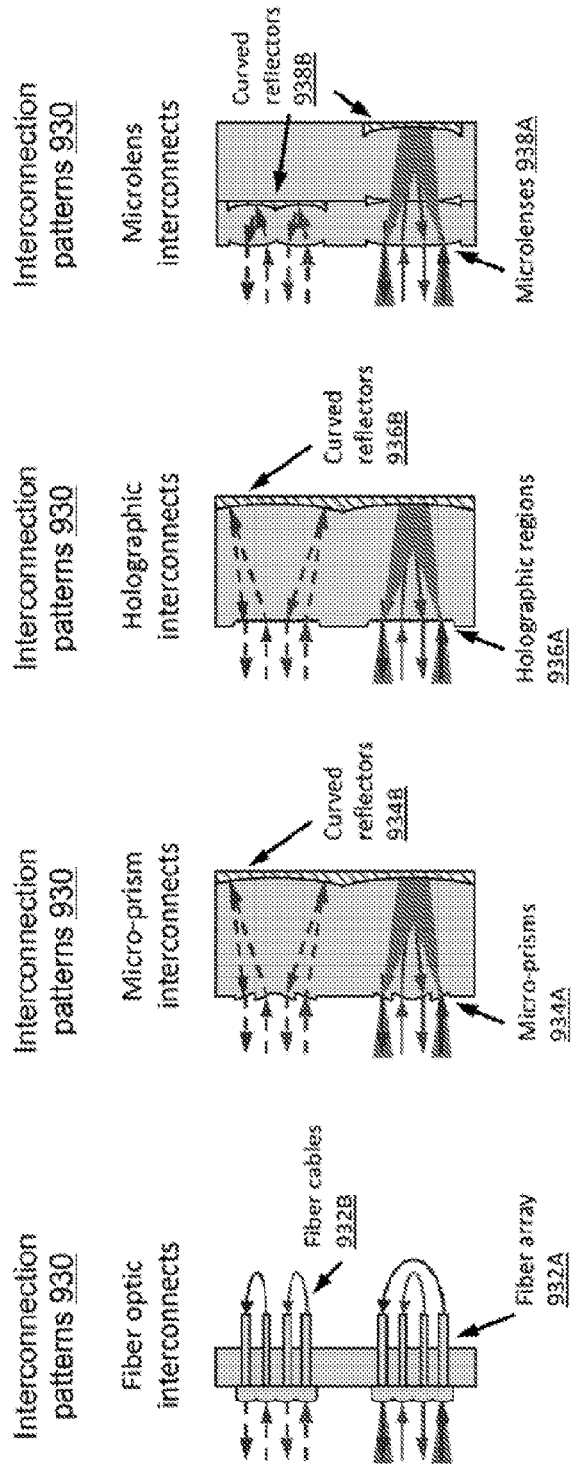
FIG. 9B depicts various optical structures for implementing interconnection patterns, in accordance with some embodiments.

FIG. 9B depicts various optical structures for implementing the plurality of interconnection patterns 930, in accordance with some example embodiments. It should be appreciated that a variety of optical structures and/or combination of optical structures may be used to implement the plurality of interconnection patterns.

For example, in some example embodiments, signals may be coupled into optical fiber arrays 932A and optical fiber cables 932B. The optical fiber arrays 932A and the optical fiber cables 932B may be used to implement the interconnection patterns 930 by, for example, the choice of cabling pattern. Alternatively and/or additionally, prisms 934A and/or curved reflectors 934B may be used to implement the interconnection patterns 930 by, for example, steering and refocusing beams of light according to the pattern of the prism facets and/or curved reflectors. In some example embodiments, holographic structures 936A and/or curved reflectors 936B may be used to implement the interconnection patterns 930 by, for example, steering and refocusing beams of light according to the pattern of the holographic structures and/or curved reflectors. Alternatively and/or additionally, refractive microlenses 938A and/or reflective microlenses 938B may be used to implement the interconnection patterns 930 by, for example, steering and refocusing light. Additionally, multiple layers of microlenses 938A and reflectors 938B may be used to facilitate interconnection. It should be appreciated that the optical structures shown in FIG. 9B may be produced with photolithographic techniques, which may reduce the cost of manufacture.

Figure 9C:
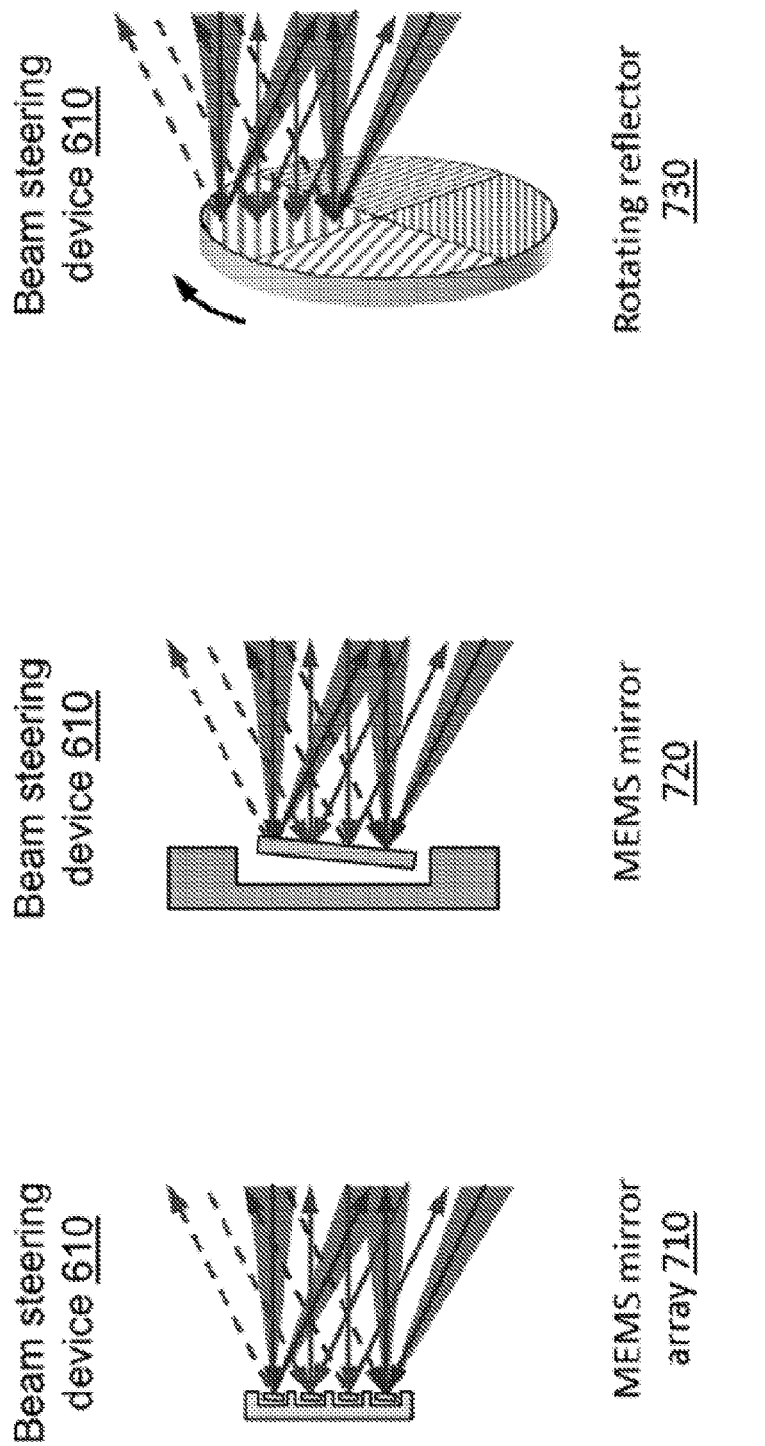
FIG. 9C depicts various beam steering devices, in accordance with some embodiments.

FIG. 9C depicts various beam steering devices, in accordance with some example embodiments. It should be appreciated that different beam steering devices may be used to implement the beam steering device 610 used in the selector switch 900. For example, in some example embodiments, the microelectromechanical (MEMS) micromirror array 710 may be used to steer one or more optical signals. Alternatively and/or additionally, the single microelectromechanical mirror 720 may be used to steer one or more optical signals. In some example embodiments, the rotating reflector 730 may be used to steer one or more optical signals. Although not shown, it should be appreciated that a liquid crystal device may also be used to steer one or more optical signals instead of and/or in addition to the microelectromechanical micromirror array 710, the single microelectromechanical mirror 720, and/or the rotating reflector 730.

Figure 10:
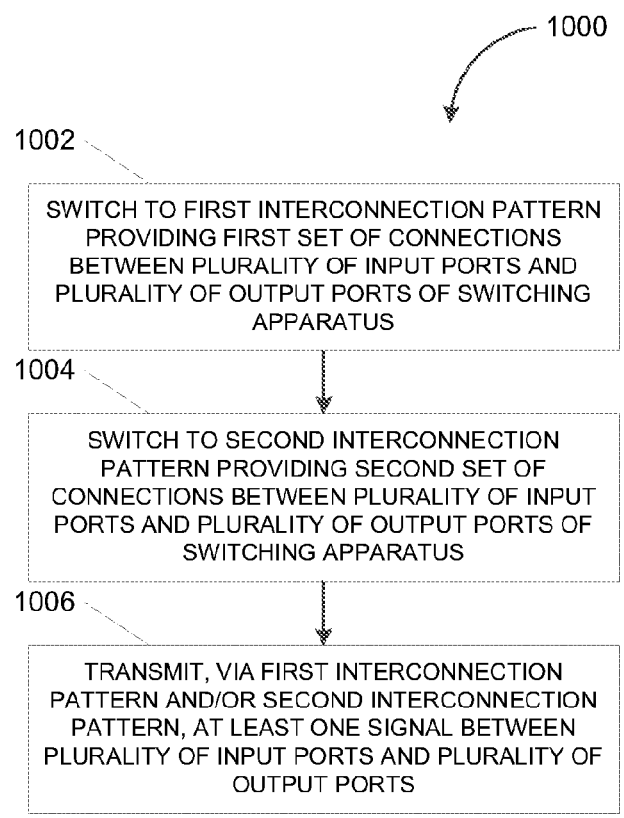
FIG. 10 depicts a flowchart illustrating a process for network switching, in accordance with some example embodiments.

FIG. 10 depicts a flowchart illustrating a process 1000 for network switching, in accordance with some example embodiments. Referring to FIGS. 2-10, the process 1000 may be performed by a switching apparatus such as, for example, the selector switch 200, the aggregate selector switch 300, the selector switch 400, the selector switch 500, the selector module 510, the selector switch 900, and/or the like. It should be appreciated that the switching apparatus may include a plurality of input ports and a plurality of output ports. The switching apparatus may be communicatively coupled with a computing network via the plurality of input ports and/or the plurality of output ports.

At 1002, the switching apparatus may switch to a first interconnection pattern providing a first set of connections between the plurality of input ports and the plurality of output ports. In some example embodiments, the switching apparatus may be configured to provide some but not all of the possible interconnection patterns between the input ports and the output ports of the switching apparatus. For instance, the switching apparatus may provide, at any one time, a subset of the N! quantity of possible interconnection patterns between an N quantity of input ports and an N quantity of output ports. Instead of providing arbitrary connectivity between input ports and output ports in the switching apparatus, the switching apparatus may cycle through a plurality of interconnection patterns, each of which provide partial connectivity between the input ports and the output ports of the switching apparatus. As such, according to some example embodiments, the switching apparatus may, at a first time $\tau_1$, switch to at least a first interconnection pattern providing direct connections between only some pairs of input ports and output ports. Referring to FIGS. 3A-D, it should be appreciated that the switching apparatus may be configured to provide multiple interconnection patterns at any one time.

At 1004, the switching apparatus may switch to a second interconnection pattern providing a second set of connections between the plurality of input ports and the plurality of output ports. As noted, the switching apparatus may cycle through a plurality of interconnection patterns, wherein each interconnection pattern provides only partial connectivity between the input ports and the output ports of the switching apparatus. Accordingly, at a second time $\tau_2$, the switching apparatus may switch to a second interconnection pattern. The second interconnection pattern may be a different interconnection pattern that provides a different subset of the possible direct connections between the input ports and the outputs of the switching apparatus. In some example embodiments, full connectivity between the input ports and the output ports of the switching apparatus may be achieved over time, for example, by cycling through a plurality of different interconnection patterns. Furthermore, even in embodiments that provide at least one direct connection between every pair of input and output ports in at least one interconnection pattern, as in FIGS. 3A-D, as well as in embodiments that do not provide at least one direct connection between every pair of input and output ports, as in FIGS. 2A-B, at least some input ports and output ports may be connected via an indirect connection that includes at least one hop through an intermediary input port and/or an output port.

At 1006, the switching apparatus may transmit, via the first interconnection pattern and/or the second interconnection pattern, at least one signal between the plurality of input ports and the plurality of output ports. In some example embodiments, the switching apparatus may relay a signal from the input ports of the switching apparatus to the output ports of the switching apparatus. The signal may be relayed through one or more interconnection patterns as the switching apparatus cycles through a plurality of interconnection patterns.

Figure 11:
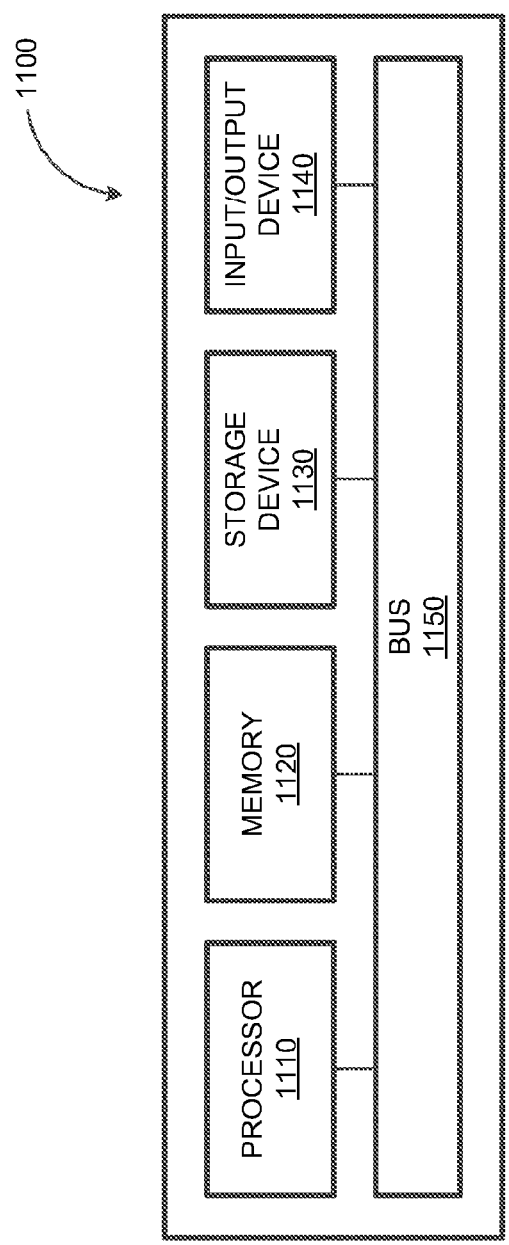
FIG. 11 depicts a block diagram illustrating a controller, in accordance with some example embodiments.

FIG. 11 depicts a block diagram illustrating a controller 11001100 consistent with implementations of the current subject matter. Referring to FIGS. 2-9, the controller 1100 may be configured to generate the control signals for controlling an operation of a switching apparatus such as, for example, the selector switch 200, the aggregate selector switch 300, the selector switch 400, and/or the like. For example, the controller 1100 may generate control signals for triggering a switch to one or more interconnection patterns. Alternately and/or additionally, the controller 1100 may generate the control signals based on a predetermined schedule such that the switching apparatus is able to cycle through different interconnection patterns independent of external controls such as, for example, inputs from a computing network coupled with the switching apparatus. Alternatively and/or additionally, the controller 1100 may generate the control signals in response to external inputs, for example, from the computing network. As such, the switch to one or more interconnection patterns may also be triggered by external controls.

As shown in FIG. 11, the controller 1100 can include a processor 1110, a memory 1120, a storage device 1130, and input/output device 1140. The processor 1110, the memory 1120, the storage device 1130, and the input/output device 1140 can be interconnected via a system bus 1150. The processor 1110 is capable of processing instructions for execution within the controller 1100. Such executed instructions can implement one or more components of, for example, the controller 1100. In some implementations of the current subject matter, the processor 1110 can be a single-threaded processor. Alternately, the processor 1110 can be a multi-threaded processor. The processor 1110 is capable of processing instructions stored in the memory 1120 and/or on the storage device 1130 to display graphical information for a user interface provided via the input/output device 1140.

The memory 1120 is a computer readable medium such as volatile or non-volatile that stores information within the controller 1100. The memory 1120 can store data structures representing configuration object databases, for example. The storage device 1130 is capable of providing persistent storage for the controller 1100. The storage device 1130 can be a floppy disk device, a hard disk device, an optical disk device, or a tape device, or other suitable persistent storage means. The input/output device 1140 provides input/output operations for the controller 1100. In some implementations of the current subject matter, the input/output device 1140 includes a keyboard and/or pointing device. In various implementations, the input/output device 1140 includes a display unit for displaying graphical user interfaces.

According to some implementations of the current subject matter, the input/output device 1140 can provide input/output operations for a network device. For example, the input/output device 1140 can include Ethernet ports or other networking ports to communicate with one or more wired and/or wireless networks (e.g., a local area network (LAN), a wide area network (WAN), the Internet).

In some implementations of the current subject matter, the controller 1100 can be used to execute various interactive computer software applications that can be used for organization, analysis and/or storage of data in various (e.g., tabular) format (e.g., Microsoft Excel®, and/or any other type of software). Alternatively, the controller 1100 can be used to execute any type of software applications. These applications can be used to perform various functionalities, e.g., planning functionalities (e.g., generating, managing, editing of spreadsheet documents, word processing documents, and/or any other objects, etc.), computing functionalities, communications functionalities, etc. The applications can include various add-in functionalities or can be stand-alone computing products and/or functionalities. Upon activation within the applications, the functionalities can be used to generate the user interface provided via the input/output device 1140. The user interface can be generated and presented to a user by the controller 1100 (e.g., on a computer screen monitor, etc.).

Figure 12:
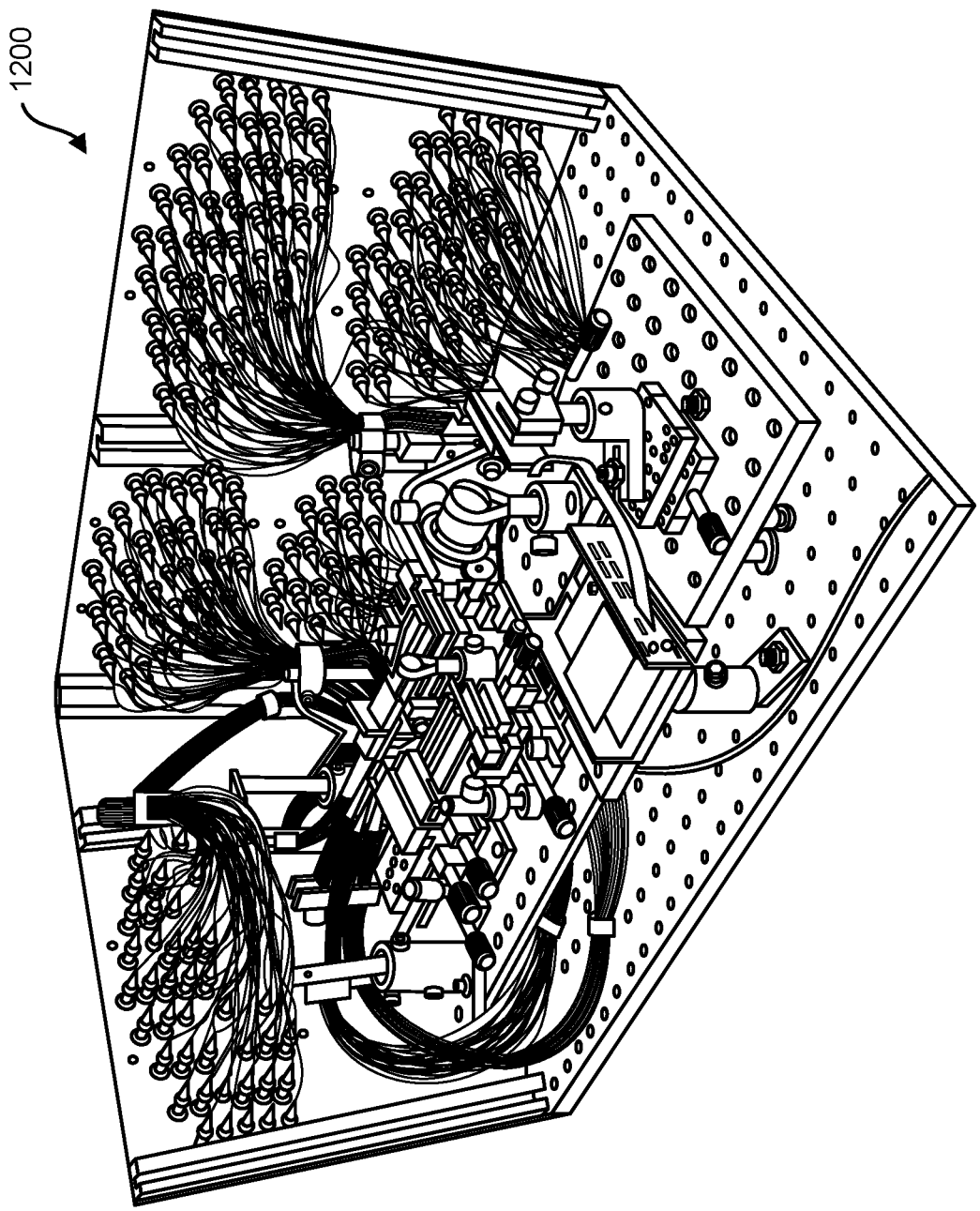
FIG. 12 depicts an example implementation of a selector switch, in accordance with some example embodiments.

FIG. 12 depicts an example implementation of a selector switch 1200, in accordance with some example embodiments. Referring to FIG. 12, in some example embodiments, the selector switch 1200 may be an optical switch configured to relay optical signals between one or more input ports and/or output ports. As shown in FIG. 12, the selector switch 1200 may be implemented using fiber arrays as input ports and output ports. However, as noted, the selector switch 1200 may be configured to relay any type of signal including, for example, electric signals, radio frequency signals, and/or the like.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus, comprising:
   a plurality of input ports;
   a plurality of output ports; and
   a subset of pre-configured interconnection patterns that excludes at least one possible interconnection pattern of a plurality of possible interconnection patterns between the plurality of input ports and the plurality of output ports, each pre-configured interconnection pattern in the subset providing a set of connections between a fixed selection of input ports and output ports from the plurality of input ports and the plurality of output ports; and
   the apparatus being communicatively coupled to a network via the plurality of input ports and/or the plurality of output ports, and the apparatus being configured to at least:
   switch, at a first time, to a first interconnection pattern from the subset of pre-configured interconnection patterns, the first interconnection pattern providing a first set of connections between the plurality of input ports and the plurality of output ports;
   switch, at a second time, to a second interconnection pattern from the subset of pre-configured interconnection patterns, the second interconnection pattern providing a second set of connections between the plurality of input ports and the plurality of output ports; and transmit, via the first interconnection pattern and/or the second interconnection pattern, at least one signal between the plurality of input ports and the plurality of output ports.

2. The apparatus of claim 1, wherein the apparatus comprises a first selector switch and a second selector switch.

3. The apparatus of claim 2, wherein the first selector switch is configured to at least switch to the first interconnection pattern, and wherein the second selector switch is configured to at least switch to the second interconnection pattern.

4. The apparatus of claim 2, wherein the first selector switch and the second selector switch are configured to operate in parallel.

5. The apparatus of claim 2, wherein the first selector switch and the second selector switch are configured to at least switch to a third interconnection pattern, wherein the first interconnection pattern and the second interconnection pattern are formed based on the third interconnection pattern, and wherein the first interconnection and the second interconnection pattern are formed by the first selector switch being coupled with a different permutation of the plurality of input ports than the second selector switch.

6. The apparatus of claim 1, wherein the subset of pre-configured interconnection patterns provides at least one connection between each of the plurality of input ports and each of the plurality of output ports.

7. The apparatus of claim 6, wherein the at least one connection comprises a direct connection between an input port and an output port.

8. The apparatus of claim 6, wherein the at least one connection comprises an indirect connection between an input port and an output port, and wherein the indirect connection includes at least one hop through an intermediary input port and/or an intermediary output port.

9. The apparatus of claim 8, wherein the apparatus is further configured to at least store, at the intermediary input port and/or the intermediary output port, data being transferred between the input port and the output port.

10. The apparatus of claim 1, wherein the apparatus comprises a subset of switching elements comprising some but not all of a plurality of switching elements fully interconnecting the plurality of input ports and the plurality of output ports, wherein the first interconnection pattern and/or the second interconnection pattern are pre-configured based at least on a selection of switching elements forming the subset of switching elements, and wherein the apparatus is configured to at least route the at least one signal via the first interconnection pattern and/or the second interconnection pattern by at least toggling the plurality of switching elements.

11. The apparatus of claim 10, wherein the plurality of switching elements comprise one or more electronic transistors, optical waveguide switching devices, passive optical elements, and/or beam steering devices.

12. The apparatus of claim 10, wherein the first interconnection pattern and/or the second interconnection pattern are formed from one or more electrically conductive wires, optical waveguides, fiber optic cables, and/or passive optical elements.

13. The apparatus of claim 1, wherein the apparatus comprises at least one selector module configured to at least switch between a first coupling and a second coupling, wherein the first coupling couples the plurality of input ports and/or the plurality of output ports with the first interconnection pattern, and wherein the second coupling couples the plurality of input ports and/or the plurality of output ports with the second interconnection pattern.

14. The apparatus of claim 13, wherein the at least one selector module comprises a first set of module ports coupled with the first interconnection pattern and a second set of module ports coupled with the second interconnection, wherein the at least one selector module is configured to at least switch to the first coupling by at least routing the at least one signal through the first set of module ports and switch to the second coupling by at least routing the at least one signal through the second set of module ports.

15. The apparatus of claim 13, wherein the at least one selector module comprises a beam steering device.

16. The apparatus of claim 13, wherein the selector module further comprises a prism array having a first prism and a second prism, wherein the first prism is aligned to direct the at least one signal to the first set of module ports, wherein the second prism is aligned to direct the at least one signal to the second set of module ports, wherein the beam steering device is configured to at least steer the at least one signal onto the first prism in order to image the at least one signal to the first set of module ports, and wherein the beam steering device is configured to at least steer the at least one signal onto the second prism in order to image the at least one signal to the second set of module ports.

17. The apparatus of claim 13, wherein the selector module further comprises a lens array having a first lens and a second lens.

18. The apparatus of claim 13, wherein the first interconnection pattern and/or the second interconnection pattern are formed from one or more fiber optic cables and/or passive optical elements.

19. A method, comprising:

switching, at a first time, to a first interconnection pattern from a subset of pre-configured interconnection patterns, the first interconnection pattern providing a first set of connections between a plurality of input ports and a plurality of output ports, the plurality of input ports and the plurality of output ports comprising an apparatus, the apparatus being communicatively coupled to a network via the plurality of input ports and/or the plurality of output ports, the subset of pre-configured interconnection patterns excluding at least one possible interconnection pattern of a plurality of possible interconnection patterns between the plurality of input ports and the plurality of output ports, and each pre-configured interconnection pattern in the subset providing a set of connections between a fixed selection of input ports and output ports from the plurality of input ports and the plurality of output ports;

switching, at a second time, to a second interconnection pattern from the subset of pre-configured interconnection patterns, the second interconnection pattern providing a second set of connections between the plurality of input ports and the plurality of output ports; and transmitting, via the first interconnection pattern and/or the second interconnection pattern, at least one signal between the plurality of input ports and the plurality of output ports.

* * * * *